(12) United States Patent
Liu et al.

(10) Patent No.: US 12,369,413 B2
(45) Date of Patent: Jul. 22, 2025

(54) METHOD FOR FORMING AN IMAGE SENSOR

(71) Applicant: Taiwan Semiconductor Manufacturing Company, Ltd., Hsin-Chu (TW)

(72) Inventors: Po-Chun Liu, Hsinchu (TW); Yung-Chang Chang, Taipei (TW); Eugene I-Chun Chen, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/354,859

(22) Filed: Jul. 19, 2023

(65) Prior Publication Data

US 2023/0369377 A1 Nov. 16, 2023

Related U.S. Application Data

(63) Continuation of application No. 17/843,088, filed on Jun. 17, 2022, now Pat. No. 11,784,207, which is a
(Continued)

(51) Int. Cl.
*H10F 39/18* (2025.01)
*H10F 39/00* (2025.01)
*H10F 39/12* (2025.01)

(52) U.S. Cl.
CPC ......... *H10F 39/184* (2025.01); *H10F 39/024* (2025.01); *H10F 39/199* (2025.01);
(Continued)

(58) Field of Classification Search
CPC ......... H01L 27/14649; H01L 27/14603; H01L 27/1463; H01L 27/14636; H01L 27/1464;
(Continued)

(56) References Cited

U.S. PATENT DOCUMENTS 10,199,423 B2 * 2/2019 Ihara ................. H01L 27/14614
11,393,866 B2 7/2022 Liu et al.
(Continued)

FOREIGN PATENT DOCUMENTS

| JP | 2006222379 A | | 8/2006 |
| JP | 2007129024 A | | 5/2007 |
| JP | 2013020998 A | * | 1/2013 |

OTHER PUBLICATIONS

Notice of Allowance dated Mar. 4, 2022 for U.S. Appl. No. 16/897,510.
(Continued)

*Primary Examiner* — Douglas W Owens
(74) *Attorney, Agent, or Firm* — Eschweiler & Potashnik, LLC

(57) ABSTRACT

Various embodiments of the present disclosure are directed towards a method for forming an image sensor in which a device layer has high crystalline quality. According to some embodiments, a hard mask layer is deposited covering a substrate. A first etch is performed into the hard mask layer and the substrate to form a cavity. A second etch is performed to remove crystalline damage from the first etch and to laterally recess the substrate in the cavity so the hard mask layer overhangs the cavity. A sacrificial layer is formed lining cavity, a blanket ion implantation is performed into the substrate through the sacrificial layer, and the sacrificial layer is removed. An interlayer is epitaxially grown lining the cavity and having a top surface underlying the hard mask layer, and a device layer is epitaxially grown filling the cavity over the interlayer. A photodetector is formed in the device layer.

20 Claims, 15 Drawing Sheets

Related U.S. Application Data continuation of application No. 16/897,510, filed on Jun. 10, 2020, now Pat. No. 11,393,866.

(60) Provisional application No. 62/908,008, filed on Sep. 30, 2019.

(52) U.S. Cl.
CPC ......... *H10F 39/802* (2025.01); *H10F 39/807* (2025.01); *H10F 39/811* (2025.01); *H10F 39/805* (2025.01); *H10F 39/8063* (2025.01)

(58) Field of Classification Search
CPC ........... H01L 27/14685; H01L 27/1462; H01L 27/146–14698; H01L 21/763; H01L 21/0243; H01L 21/0245; H01L 21/02532; H01L 21/02658; H10F 39/184; H10F 39/802; H10F 39/807; H10F 39/811; H10F 39/199; H10F 39/024; H10F 39/805; H10F 39/8063; H10F 39/011; H10F 39/026; H10F 39/80; H10F 39/016; Y02P 70/50

See application file for complete search history.

(56) References Cited

U.S. PATENT DOCUMENTS

| | | |
|---|---|---|
| 2008/0073740 A1 | 3/2008 | Shibayama |
| 2012/0112255 A1 | 5/2012 | Kondo et al. |
| 2017/0069674 A1 | 3/2017 | Miyanami |
| 2019/0074312 A1 | 3/2019 | Yamakawa et al. |
| 2019/0341508 A1 | 11/2019 | Lee et al. |
| 2020/0152683 A1* | 5/2020 | Akiyama .......... H01L 27/14647 |

OTHER PUBLICATIONS

Non-Final Office Action dated Feb. 1, 2023 for U.S. Appl. No. 17/843,088.

Notice of Allowance dated Jun. 7, 2023 for U.S. Appl. No. 17/843,088.

\* cited by examiner

METHOD FOR FORMING AN IMAGE SENSOR

REFERENCE TO RELATED APPLICATIONS

This application is a Continuation of U.S. application Ser. No. 17/843,088, filed on Jun. 17, 2022, which is a Continuation of U.S. application Ser. No. 16/897,510, filed on Jun. 10, 2020 (now U.S. Pat. No. 11,393,866, issued on Jul. 19, 2022), which claims the benefit of U.S. Provisional Application No. 62/908,008, filed on Sep. 30, 2019. The contents of the above-referenced patent applications are hereby incorporated by reference in their entirety.

BACKGROUND

Integrated circuits (IC) with image sensors are used in a wide range of modern-day electronic devices, such as, for example, cameras and cell phones. In recent years, complementary metal-oxide-semiconductor (CMOS) image sensors have begun to see widespread use, largely replacing charge-coupled devices (CCD) image sensors. Compared to CCD image sensors, CMOS image sensors are increasingly favored due to low power consumption, small size, fast data processing, direct output of data, and low manufacturing cost. Some types of CMOS image sensors include front side illuminated (FSI) image sensors and back side illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
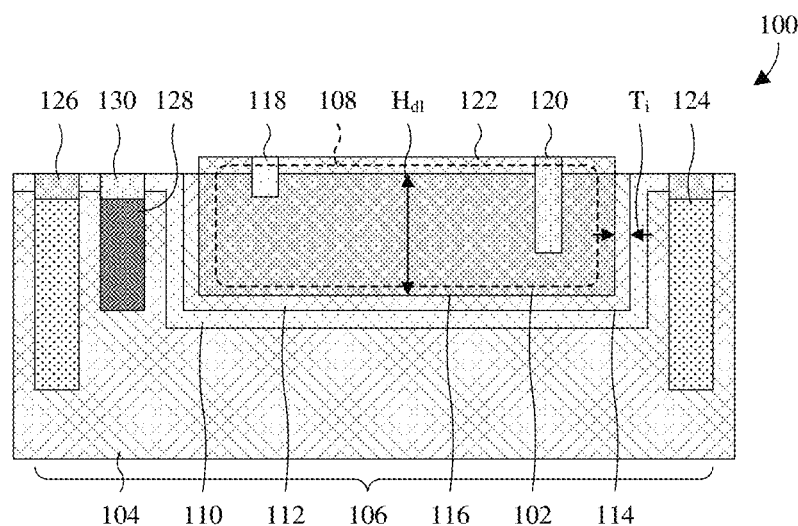
FIG. 1 illustrates a cross-sectional view of some embodiments of an image sensor in which a device layer is recessed into a substrate and has high crystalline quality.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Complementary metal-oxide-semiconductor (CMOS) image sensors may be employed to detect near infrared (NIR) and infrared (IR) radiation. This may arise for CMOS image sensors employed for time-of-flight (ToF) imaging and other suitable types of imaging. However, CMOS image sensors typically comprise silicon-based photodetectors. Silicon has a large bandgap and is hence poor at absorption of NIR and IR radiation. Therefore, CMOS image sensors may have poor quantum efficiency (QE) for NIR and IR radiation. To mitigate this, silicon-based photodetectors may be replaced by photodetectors based on germanium or some other suitable type of semiconductor material having a smaller bandgap.

A method for forming such a CMOS image sensor may comprise performing a dry etch selectively into a substrate to form a cavity, epitaxially growing a device layer having a smaller bandgap than the substrate in the cavity, and forming a photodetector in the device layer. Because the photodetector is formed in the device layer, signal-to-noise ratio (SNR), QE, and other suitable performance metrics of the photodetector depend upon crystalline quality of the device layer. For example, poor crystalline quality may increase leakage current and may hence degrade the performance metrics. However, different lattice constants and/or different coefficients of thermal expansion between the substrate and the device layer may lead to crystalline defects at an interface between the substrate and the device layer and may hence degrade crystalline quality of the device layer.

Further, ion bombardment by the dry etching may cause crystalline defects at the interface and may hence degrade crystalline quality of the device layer.

To reduce leakage current caused by crystalline defects at the interface, a blanket ion implantation may be performed into the substrate between the dry etch and the epitaxial growth to form a substrate implant region lining the trench. The blanket ion implantation has a same doping type as, but a higher doping concentration than, a bulk of the substrate and reduces carriers induced by crystalline defects at the interface. However, the blanket ion implantation may itself cause crystalline defects at the interface, which reduces its effectiveness at reducing leakage current. Further, dopants from the substrate implant region may diffuse to the device layer and create a low resistivity region. The low resistivity region may, in turn, increase leakage current across the interface and may hence increase inter-pixel leakage current.

Various embodiments of the present application are directed towards a method for forming an image sensor in which a device layer is recessed into a substrate and has high crystalline quality. Further, various embodiments of the present disclosure are directed towards the image sensor resulting from the method. According to some embodiments of the method, a hard mask layer is deposited over a substrate. A first etch is performed selectively into the hard mask layer and the substrate to form a cavity. A second etch is performed into the substrate to remove crystalline damage from the first etch. Further, the second etch recesses the substrate relative to the hard mask layer in the cavity so the hard mask layer overhangs the cavity. A sacrificial dielectric layer is formed lining the cavity, a blanket ion implantation is performed into the substrate through the sacrificial dielectric layer to form a substrate implant region lining the cavity, and the sacrificial dielectric layer is removed. An interlayer is epitaxially grown lining the cavity and having a top surface underlying the hard mask layer, and a device layer is epitaxially grown filling the cavity over the interlayer. A planarization is performed to flatten a top surface of the device layer, and a photodetector is formed in the device layer.

Because the second etch removes the crystalline damage from the first etch, there are fewer crystalline defects at surfaces of the substrate in the cavity. Further, because the blanket ion implantation is performed through the sacrificial dielectric layer, the blanket ion implantations causes fewer or no crystalline defects at the substrate surfaces. Because the second etch and the sacrificial dielectric layer reduce crystalline defects at the substrate surfaces, leakage current is reduced. Further, the interlayer and the device layer epitaxially grow with higher crystalline quality (e.g., fewer crystalline defects). Because the interlayer and the device layer epitaxially grow with higher crystalline quality, leakage current is reduced. The reduce leakage current, in turn, increases performance of the photodetector.

The substrate implant region reduces carriers induced by crystalline defects along the interlayer. Hence, leakage current is reduced and performance of the photodetector is improved. Further, the interlayer blocks diffusion of dopants from the substrate implant region to the device layer. Dopants that diffuse to the device layer may create a low resistivity region that increases leakage current between the substrate and the device layer and hence increases inter-pixel leakage current. Therefore, because the interlayer blocks the diffusion, the interlayer reduces leakage current and increases performance of the photodetector.

With reference to FIG. 1, a cross-sectional view 100 of some embodiments of an image sensor is provided in which a device layer 102 is recessed into a substrate 104 at a pixel 106. The device layer 102 and the substrate 104 are different semiconductor materials, and the device layer 102 accommodates a photodetector 108 individual to the pixel 106. The device layer 102 may, for example, be or comprise germanium, silicon germanium, some other suitable semiconductor material(s), or any combination of the foregoing. In some embodiments, a bulk of the device layer 102 is undoped. The substrate 104 may, for example, be or comprise silicon and/or some other suitable semiconductor material(s). In some embodiments, a bulk of the substrate 104 is doped with P-type or N-type dopants.

A substrate implant region 110 is in the substrate 104 and lines the device layer 102. The substrate implant region 110 has the same doping type as, but a higher doping concentration than, a bulk of the substrate 104. For example, the substrate implant region 110 and the bulk of the substrate 104 may both be P-type or N-type. In some embodiments, a doping concentration of the substrate implant region 110 is about 1e17-5e18 atoms per cubic centimeter, is greater than about 5e18 atoms per cubic centimeter, or is some other suitable doping concentration.

An interlayer 112 cups an underside of the device layer 102 and separates the device layer 102 from the substrate implant region 110. The interlayer 112 is an undoped semiconductor material different than that of the device layer 102. In alternative embodiments, the interlayer 112 is a lightly doped semiconductor material that is different than that of the device layer 102 and/or that has a lesser doping concentration than the substrate implant region 110. The light doping may, for example, have a doping concentration less than about 1e15 atoms per cubic centimeter or some other suitable value. The interlayer 112 may, for example, be or comprise silicon and/or some other suitable semiconductor material. In some embodiments, the interlayer 112 is or comprises the same semiconductor material as the substrate 104. For example, the interlayer 112 and the substrate 104 may both be silicon, whereas the device layer 102 may be germanium or silicon germanium. Other suitable materials are, however, amenable.

The substrate implant region 110 reduces carriers induced by crystalline defects at a first interface 114 between the interlayer 112 and the substrate 104 and/or at a second interface 116 between the interlayer 112 and the device layer 102. As a result, leakage current at the first and/or second interface(s) 114, 116 may be reduced and performance of the photodetector 108 may be increased. For example, QE, SNR, and other suitable performance metrics of the photodetector 108 may be increased. The crystalline defects may, for example, include threading dislocation defects arising from different lattice constants and/or different coefficients of thermal expansion between the device layer 102 and the substrate 104.

The interlayer 112 has a high resistance from the first interface 114 to the second interface 116 to reduce leakage current from the device layer 102 to the substrate 104. By reducing leakage current from the device layer 102 to the substrate 104, inter-pixel leakage current is reduced and performance of the photodetector 108 is increased. The high resistance may, for example, be greater than about 100 kiloohms or some other suitable value. The interlayer 112 further blocks dopants from the substrate implant region 110 from diffusing to the device layer 102. For example, the substrate implant region 110 may have a P-type doping and the interlayer 112 may block boron or other suitable P-type dopants from diffusing to the device layer 102. Dopants that diffuse to the device layer 102 may create a low resistance region from the substrate 104 to the device layer 102 and may hence increases inter-pixel leakage current. Because the interlayer 112 blocks the diffusion, the resistance from the substrate 104 to the device layer 102 may remain high and leakage current may remain low.

As seen hereafter, a method for forming the device layer 102 recessed into the substrate 104 may, for example, comprise: performing a first etch selectively into the substrate 104 to form a cavity; performing a second etch into the substrate 104 to remove crystalline damage to the substrate 104 from the first etch; epitaxially growing the interlayer 112 lining and partially filling the cavity; and epitaxially growing the device layer 102 filling a remainder of the cavity over the interlayer 112. Other suitable methods are, however, amenable. The first etch may, for example, be performed by dry etching or some other suitable type of etching and may, for example, cause the crystalline damage by ion bombardment. The second etch etches with no or minimal crystalline damage to the substrate 104 and may, for example, etch by chemical reaction and/or without dependence on ion bombardment. The second etch may, for example, be performed by chemical dry etching (CDE), wet etching, or some other suitable type of etching.

Because the second etch removes the crystalline damage, crystalline defects at the first interface 114 are reduced. As a result, the interlayer 112 and the device layer 102 may be epitaxially grown with higher crystalline quality. Further, crystalline defects at the second interface 116 may be reduced. The reduced crystalline defects and the higher crystalline quality reduce leakage current and improve performance of the photodetector 108.

As seen hereafter, a method for forming the substrate implant region 110 may, for example, comprise: performing an etch selectively into the substrate 104 to form a cavity; depositing a sacrificial dielectric layer lining the cavity by thermal oxidation of the substrate 104; performing a blanket ion implantation into the substrate 104 through the sacrificial dielectric layer to form the substrate implant region 110 lining the cavity; and removing the sacrificial dielectric layer. Other suitable methods are, however, amenable. Because the blanket ion implantation is performed through the sacrificial dielectric layer, the blanket ion implantations causes no or minimal crystalline damage to surfaces of the substrate 104 at the first interface 114. As a result, the interlayer 112 and the device layer 102 may be epitaxially grown with higher crystalline quality. Further, crystalline defects at the second interface 116 may be reduced. The reduced crystalline defects and the higher crystalline quality reduce leakage current and improve performance of the photodetector 108.

As discussed above, a method for forming the device layer 102 may remove crystalline damage caused while forming a cavity within which the device layer 102 is formed. Further, a method for forming the substrate implant region 110 may be performed through a sacrificial dielectric layer to avoid crystalline damage to the substrate 104. As a result, the interlayer 112 and the device layer 102 may have high crystalline quality and a threading dislocation density (TDD) at the first interface 114 and/or the second interface 116 may be low. For example, the device layer 102 may have a low TDD at the second interface 116 that is less than about 3e7 threading dislocations per center squared or some other suitable value.

The photodetector 108 includes a first contact region 118 and a second contact region 120. The first and second contact regions 118, 120 are doped semiconductor regions in the device layer 102 and are respectively on opposite sides of the device layer 102. The first contact region 118 has a first doping type, whereas the second contact region 120 has a second doping type that is opposite to the first doping type. The first and second doping types may, for example, respectively be N-type and P-type or vice versa. The photodetector 108 may, for example, be a PIN photodiode or some other suitable type of photodiode.

A cap layer 122 overlies the device layer 102 and protects the device layer 102 while forming silicide layers (not shown) and an interconnect structure (not shown) over the device layer 102. This prevents crystalline damage to the device layer 102, which may degrade performance of the photodetector 108. The cap layer 122 may, for example, be the same material as the substrate 104 and/or may, for example, be or comprise silicon or some other suitable semiconductor material. Further, the cap layer 122 may, for example, be undoped.

A deep implant isolation (DII) region 124 and a shallow implant isolation (SII) region 126 are in the substrate 104 to provide electrical isolation between the pixel 106 and neighboring pixels (not shown). The DII region 124 has a pair of DII segments respectively on opposite sides of the pixel 106, and the SII region 126 has a pair of SII segments respectively overlying the DII region segments. In some embodiments, the DII region 124 and/or the SII region 126 extend(s) in a closed path (not fully visible in the cross-sectional view 100) along a boundary of the pixel 106 to surround the pixel 106. The DII region 124 and the SII region 126 share a doping type, but the SII region 126 has a greater doping concentration than the DII region 124. The shared doping type may, for example, be opposite to that of a bulk of the substrate 104.

A deep substrate implant (DSI) region 128 and a shallow substrate implant (SSI) region 130 are in the substrate 104 between the device layer 102 and the DII region 124. In alternative embodiments, the DSI region 128 is omitted. The SSI region 130 overlies the DSI region 128 and shares a doping type with the DSI region 128. The shared doping type may, for example, be the same as that of a bulk of the substrate 104. Further, the SSI region 130 has a higher doping concentration than the DSI region 128 and the substrate 104.

In some embodiments, the device layer 102 is or comprise a material with a high absorption coefficient for NIR radiation and/or IR radiation relative to silicon. For example, the device layer 102 may be or comprise germanium or other suitable materials. Accordingly, the image sensor may be employed to detect NIR radiation and/or IR radiation. This finds application for ToF imaging and other suitable types of imaging. NIR radiation may, for example, include wavelengths of about 850-940 nanometers, about 850-1550 nanometers, about 850-1200 nanometers, about 1200-1550 nanometers, some other suitable wavelengths, or any combination of the foregoing. IR radiation may, for example, include wavelengths of about 1.5-30 micrometers and/or other suitable wavelengths. In some embodiments, the device layer 102 has a high quantum efficiency greater than about 80% or some other suitable value for wavelengths of about 850-940 nanometers and for other suitable wavelengths. Such embodiments may, for example, arise when the device layer 102 is or comprise germanium or other suitable materials.

In some embodiments, the device layer 102 has a small bandgap relative to silicon. Such a small bandgap may, for example, result in a high absorption coefficient for NIR and/or IR radiation relative to silicon. In some embodiments, the device layer 102 has a small bandgap relative to the substrate 104, the interlayer 112, the cap layer 122, or any combination (e.g., all) of the foregoing. In some embodiments, the device layer 102 has a high absorption coefficient for NIR and/or IR radiation relative to the substrate 104, the interlayer 112, the cap layer 122, or any combination (e.g., all) of the foregoing. In some embodiments, the device layer 102 comprises silicon, germanium, or some other suitable element(s).

In some embodiments, the device layer 102 has a height $H_{dl}$ that is between about 2-50 micrometers, about 2-26 micrometers, about 25-50 micrometers, or some other suitable value. If the height $H_{dl}$ is too small (e.g., less than about 2 micrometers or some other suitable value), the device layer 102 may have poor absorption for incident photons and the photodetector 108 may have poor performance. If the height $H_{dl}$ is too large (e.g., greater than about 50 micrometers or some other suitable value), formation of the device layer 102 recessed into the substrate 104 may take a long time and may significantly impact manufacturing throughput.

In some embodiments, the interlayer 112 has a thickness $T_i$ that is about 430-1000 angstroms, about 430-715 angstroms, about 715-1000 angstroms, or some other suitable value. If the thickness $T_i$ is too low (e.g., less than about 430 angstroms or some other suitable value), the interlayer 112 may be unable to block diffusion of dopants from the substrate implant region 110 to the device layer 102 and/or a resistance between the device layer 102 and the substrate 104 may be low. As a result, leakage current may be high between the substrate 104 and the device layer 102 and may negatively impact performance of the photodetector 108. If the thickness $T_i$ is too high (e.g., greater than about 1000 angstroms or some other suitable value), the interlayer 112 may take a long time to epitaxially grow and may significantly impact throughout.

In some embodiments, the thickness $T_i$ is about 450 angstroms, a resistance from the first interface 114 to the second interface 116 is about 106 kiloohms, and a doping concentration of the substrate implant region 110 is about 5e17 atoms per cubic centimeter. In other embodiments, the thickness $T_i$ is about 900 angstroms, the resistance is about 1020 kiloohms, and the doping concentration of the substrate implant region 110 is about 5e17 atoms per cubic centimeter. Other thicknesses, resistances, and doping concentrations are, however, amenable.

Figure 2:
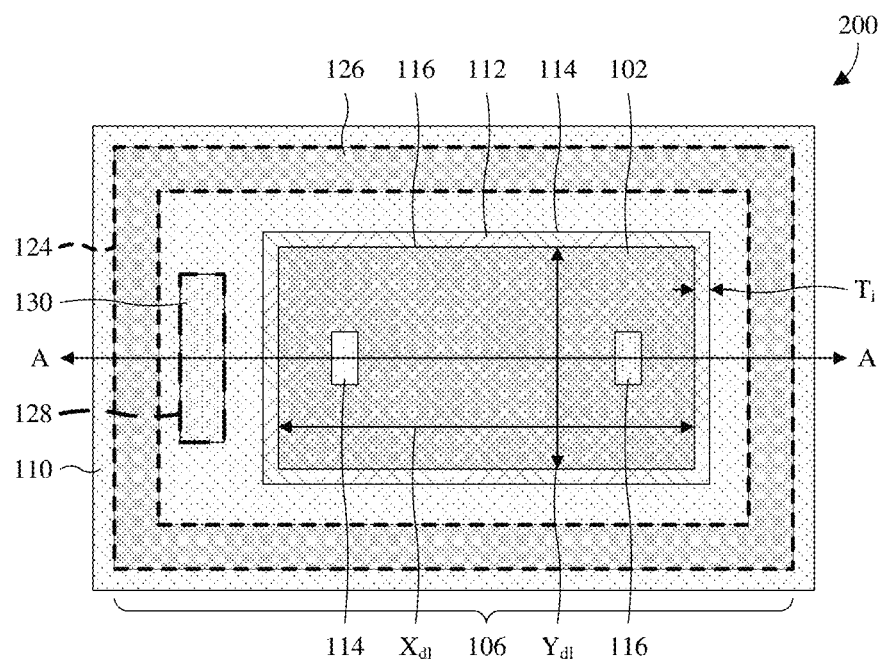
FIG. 2 illustrates a top layout of some embodiments of the image sensor of FIG. 1.

With reference to FIG. 2, a top layout 200 of some embodiments of the image sensor of FIG. 1 is provided. The cross-sectional view 100 of FIG. 1 may, for example, be take along line A. The interlayer 112 extends laterally in a closed path around the device layer 102. Further, the interlayer 112 has a thickness $T_i$, whereas the device layer 102 has a first dimension $X_{dl}$ and a second dimension $Y_{dl}$. In some embodiments, the thickness $T_i$ may, for example, be about 0.1-1.0, about 0.1-0.5, or about 0.5-1.0 percent of an average of the first and second dimensions $X_{dl}$, $Y_{dl}$. For example, the thickness $T_i$ may be equal to 0.1%*$(X_{dl}+Y_{dl})/2$ to 1.0%*$(X_{dl}+Y_{dl})/2$. In other embodiments, the thickness $T_i$ has some other suitable value.

The SII region 126 and the DII region 124 (shown in phantom) extend laterally along a periphery of the pixel 106 in a closed path to surround the pixel 106 and to separate the pixel 106 from neighboring pixels. The SSI region 130 and the DSI region 128 (shown in phantom) are between the SII region 126 and the device layer 102. The SII region 126, the DII region 124, the SSI region 130, the DSI region 128, or any combination of the foregoing may, for example, have other suitable locations and/or layouts in alternative embodiments.

Figure 3:
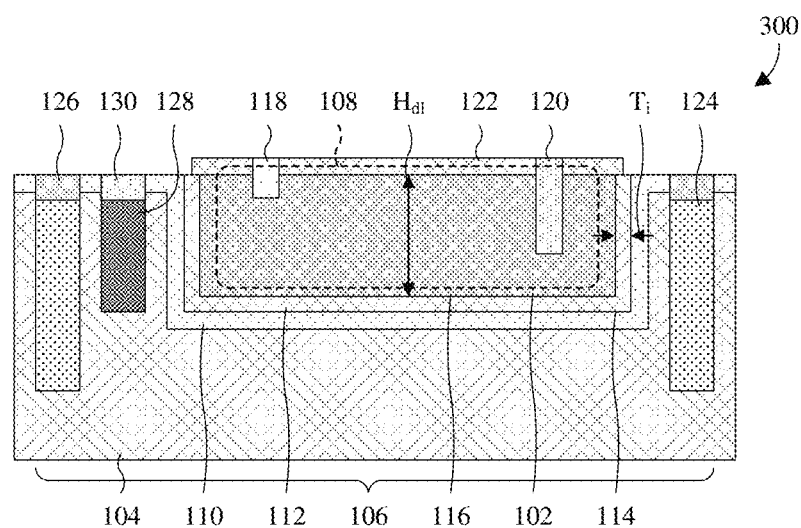
FIG. 3 illustrates a cross-sectional view of some alternative embodiments of the image sensor of FIG. 1 in which a cap layer partially covers a top surface of an interlayer.

With reference to FIG. 3, a cross-sectional view 300 of some alternative embodiments of the image sensor of FIG. 1 is provided in which the cap layer 122 partially covers a top surface of the interlayer 112. As seen hereafter, the interlayer 112 may be formed while a hard mask layer (not shown) overhangs a cavity within which the device layer 102 is later formed. Depending upon a thickness $T_i$ of the interlayer 112 and the extent of the overhang, the interlayer 112 may be formed with the top surface partially or fully underlying the hard mask layer. If the top surface of the interlayer 112 is formed partially underlying the hard mask layer, the cap layer 122 may form partially overlying the top surface as illustrated.

Figure 4:
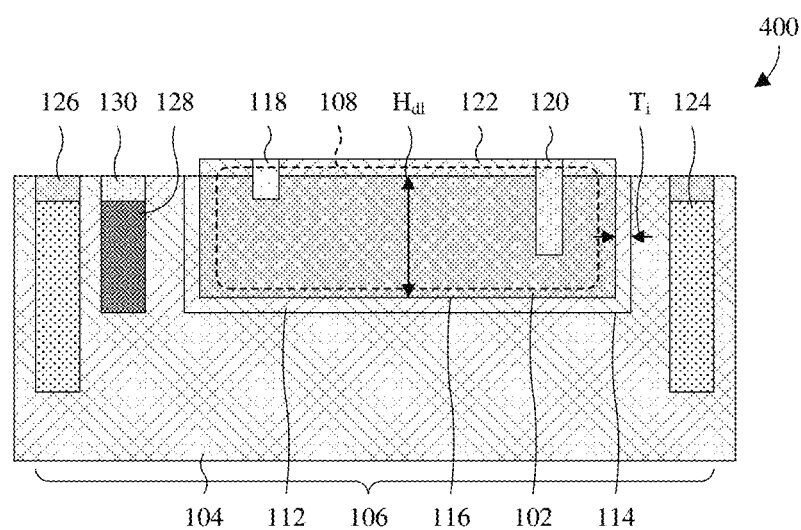
FIG. 4 illustrates a cross-sectional view of some alternative embodiments of the image sensor of FIG. 1 in which a substrate implant region is omitted.

With reference to FIG. 4, a cross-sectional view 400 of some alternative embodiments of the image sensor of FIG. 1 is provided in which the substrate implant region 110 is omitted. While the interlayer 112 no longer serves to block dopants of the substrate implant region 110 from diffusing to the device layer 102, the interlayer 112 may still provide a high resistance between the device layer 102 and the substrate 104. The high resistance may, for example, be greater than about 100 kiloohms or some other suitable value. Because of the high resistance, leakage current between the device layer 102 and the substrate 104 may be reduced and performance of the photodetector 108 may be increased.

Figure 5:
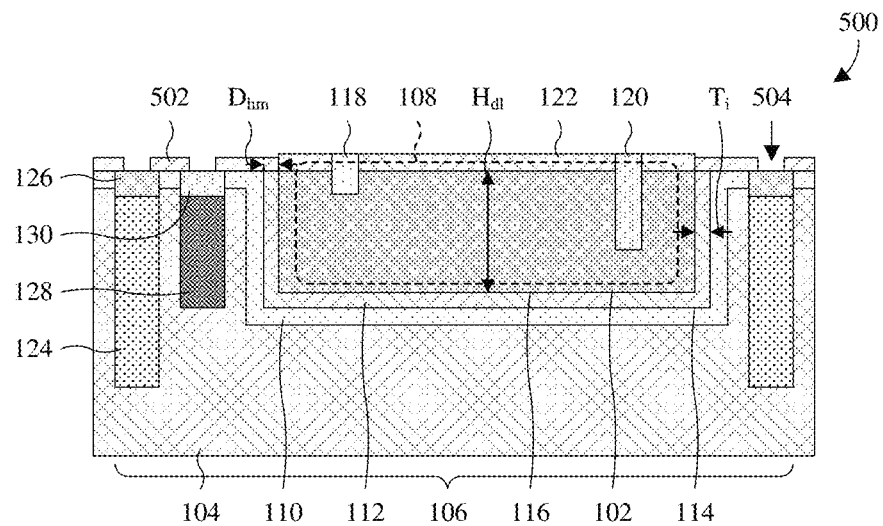
FIG. 5 illustrates a cross-sectional view of some alternative embodiments of the image sensor of FIG. 1 in which a hard mask layer overlies the substrate.

With reference to FIG. 5, a cross-sectional view 500 of some alternative embodiments of the image sensor of FIG. 1 is provided in which a hard mask layer 502 overlies the substrate 104 and the interlayer 112. The hard mask layer 502 has openings 504 exposing the SII region 126 and the SSI region 130. Further, the hard mask layer 502 extends beyond a sidewall of the substrate 104, towards the cap layer 122, by a distance $D_{hm}$ that is equal to or about equal to a thickness $T_i$ of the interlayer 112. In alternative embodiments, the distance $D_{hm}$ is less than or more than the thickness $T_i$. The hard mask layer 502 may, for example, be undoped silicate glass (USG), oxide, some other suitable dielectric(s), or any combination of the foregoing.

As seen hereafter, the hard mask layer 502 may be employed as a hard mask while forming a cavity within which the interlayer 112 and the device layer 102 are formed. In some embodiments, the hard mask layer 502 is removed thereafter and does not persist to the final structure of the image sensor. In alternative embodiments, the hard mask layer 502 is not removed and persists into the final structure of the image sensor.

Figure 6:
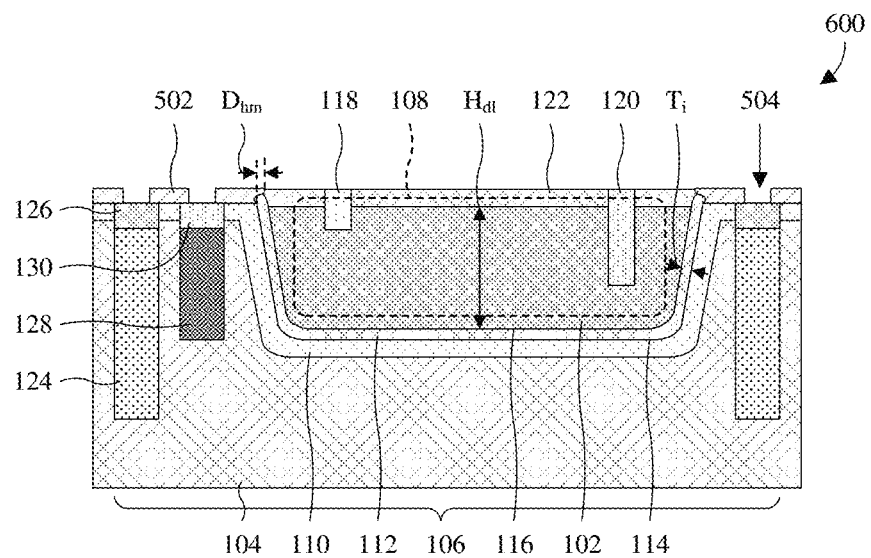
FIGS. 6 and 7 illustrate cross-sectional views of some alternative embodiments of the image sensor of FIG. 5 in which constituents of the image sensor are varied.
Figure 7:
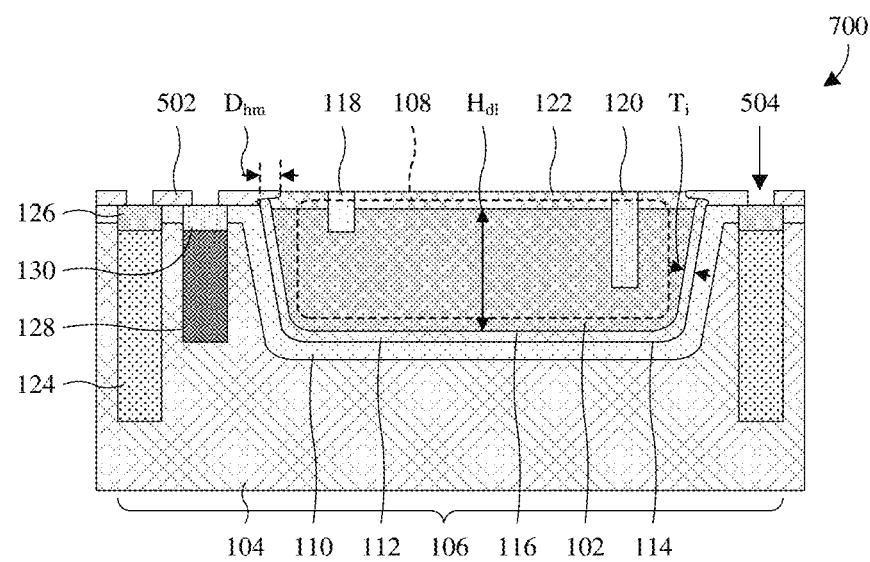

With reference to FIGS. 6 and 7, cross-sectional views 600, 700 of some alternative embodiments of the image sensor of FIG. 5 are provided in which constituents of the image sensor are varied. In both FIGS. 6 and 7, sidewalls of the device layer 102 are slanted. Further, some corners respectively of the substrate implant region 110, the interlayer 112, the device layer 102, and the hard mask layer 502 are rounded. In FIG. 6, the distance $D_{hm}$ that the hard mask layer 502 extends is less than in FIG. 7.

Figure 8:
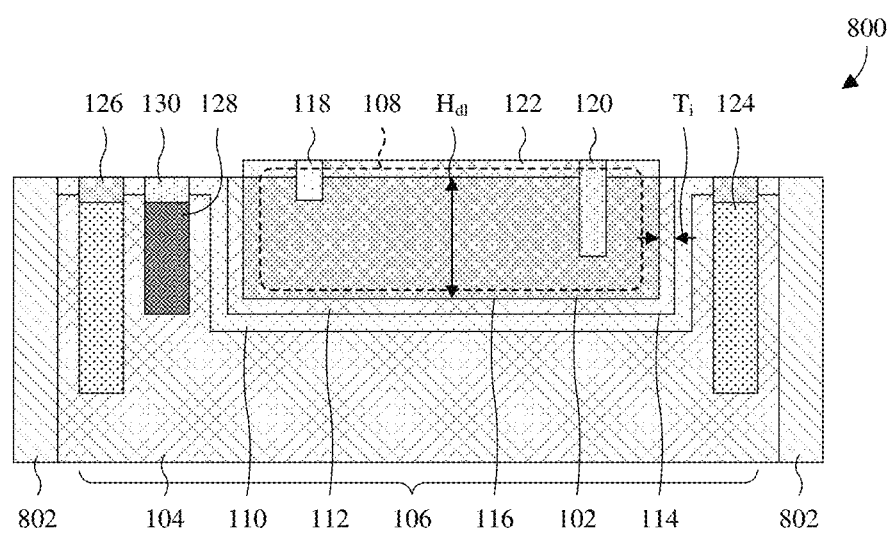
FIG. 8 illustrates a cross-sectional view of some alternative embodiments of the image sensor of FIG. 1 in which a substrate dielectric layer is on outermost sidewalls of the substrate.

With reference to FIG. 8, a cross-sectional view 800 of some alternative embodiments of the image sensor of FIG. 1 is provided in which a substrate dielectric layer 802 has a pair of segments lining outermost sidewalls of the substrate 104 that are respectively on opposite sides of the substrate 104. While a single pixel 106 is between the segments of the substrate dielectric layer 802, it is to be appreciated that additional pixels may be between the segments. Each of these additional pixels may, for example, be as their counterpart is illustrated and described.

In some embodiments, the substrate 104 is entirely between the segments of the substrate dielectric layer 802.

In some embodiments, the substrate dielectric layer 802 extends in a closed path (not visible in the cross-sectional view 800) along the boundary of the substrate 104 to entirely surround the substrate 104. In some embodiments, the substrate dielectric layer 802 has a same height as the substrate 104. In some embodiments, the substrate dielectric layer 802 has a top surface that is even or about even with that of the substrate 104 and/or has a bottom surface that is even or about even with that of the substrate 104. The substrate dielectric layer 802 may, for example, be or comprise silicon oxide and/or some other suitable dielectric(s).

As seen hereafter, the device layer 102 may be formed by epitaxial growth. The substrate dielectric layer 802 protects the outermost sidewalls of the substrate 104 so material of the device layer 102 does not epitaxially grow on the sidewalls. Further, in some embodiments, the substrate dielectric layer 802 is on and protects a bottom surface of the substrate 104 during the epitaxial growth so material of the device layer 102 does not epitaxially grow on the bottom surface. In at least some of these embodiments, portions of the device layer 102 on the bottom surface may be subsequently removed by a planarization or some other suitable process.

Figure 9A:
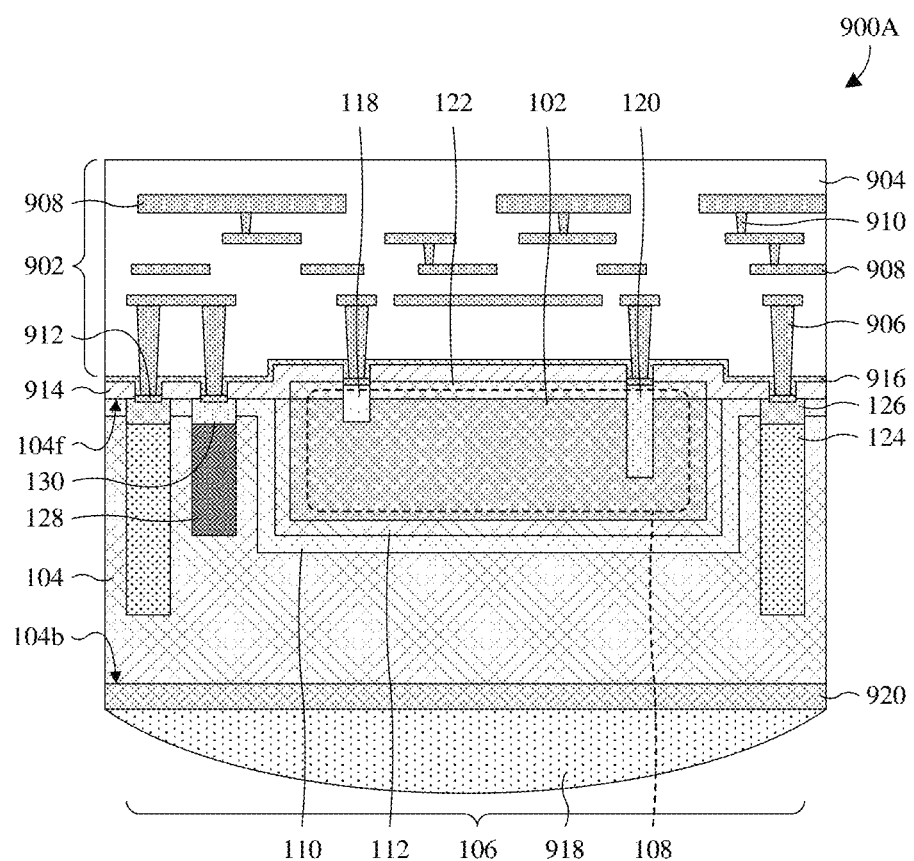
FIGS. 9A and 9B illustrate cross-sectional views of some more detailed embodiments of the image sensor of FIG. 1 in which the image sensor further includes an interconnect structure and is respectively back side illuminated (BSI) and front side illuminated (FSI).
Figure 9B:
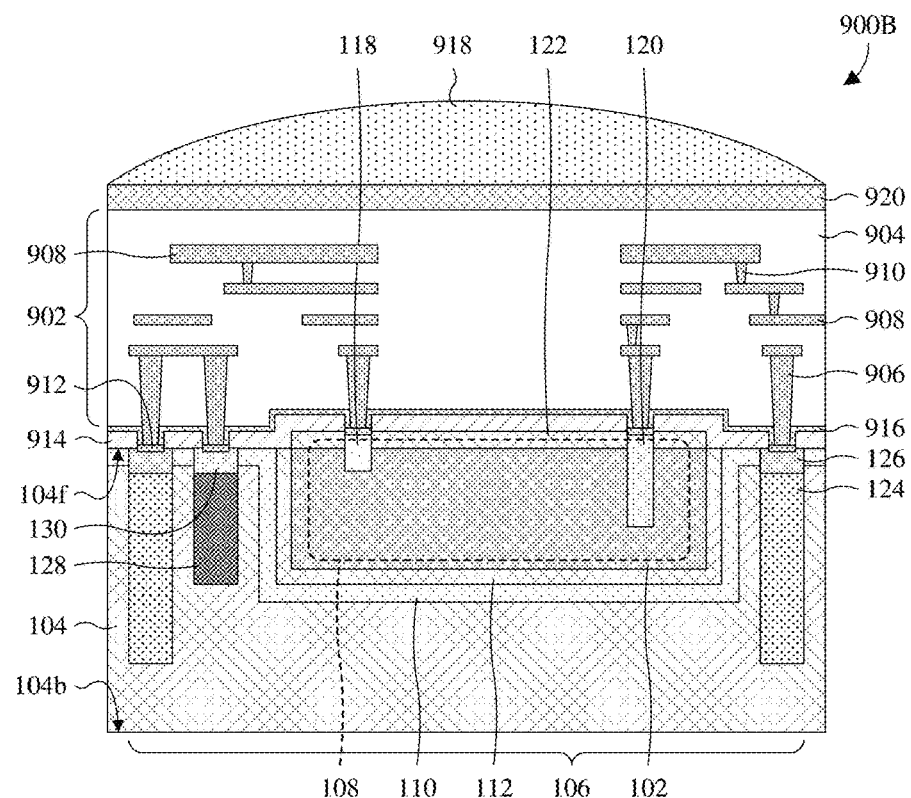

With reference to FIGS. 9A and 9B, cross-sectional views 900A, 900B of some more detailed embodiments of the image sensor of FIG. 1 are provided in which the image sensor further includes an interconnect structure 902 and is respectively BSI and FSI. The interconnect structure 902 overlies the cap layer 122 on a front side 104f of the substrate 104. Further, the interconnect structure 902 comprises an interconnect dielectric layer 904, a plurality of contacts 906, a plurality of wires 908, and a plurality of vias 910. The interconnect dielectric layer 904 may, for example, be or comprise silicon oxide and/or some other suitable dielectric(s).

The contacts 906, the wires 908, and the vias 910 are in the interconnect dielectric layer 904. The contacts 906 extend from silicide layers 912 that are respectively on the first and second contact regions 118, 120, the SII region 126, and the SSI region 130. The wires 908 and the vias 910 are alternatingly stacked over and electrically coupled to the contacts 906. The contacts 906, the wires 908, and the vias 910 may, for example, be or comprise metal and/or some other suitable conductive material(s). The silicide layers 912 may, for example, be or comprise nickel silicide and/or some other suitable silicide(s).

A resist protect dielectric (RPD) layer 914 and a contact etch stop layer (CESL) 916 separate the interconnect structure 902 from the cap layer 122 and the substrate 104. The RPD layer 914 may, for example, define locations at which the silicide layers 912 are formed during formation of the image sensor. Further, the RPD layer 914 may, for example, be or comprise silicon oxide and/or some other suitable dielectric(s). The CESL 916 may, for example, serve as an etch stop while forming the contacts 906. Further, the CESL 916 may, for example, be or comprise silicon nitride and/or some other suitable dielectric(s).

In the FIG. 9A, where the image sensor is BSI, a micro lens 918 underlies the substrate 104 on a back side 104b of the substrate 104. Further, an antireflective layer 920 separates the micro lens 918 from the back side 104b of the substrate 104. In FIG. 9B, where the image sensor is FSI, the micro lens 918 overlies the interconnect structure 902 on the front side 104f of the substrate 104. Further, the antireflective layer 920 separates the micro lens 918 from the interconnect structure 902. Regardless of whether the image sensor is BSI or FSI, the micro lens 918 corresponds to and focuses incident radiation on the photodetector 108.

Figure 10:
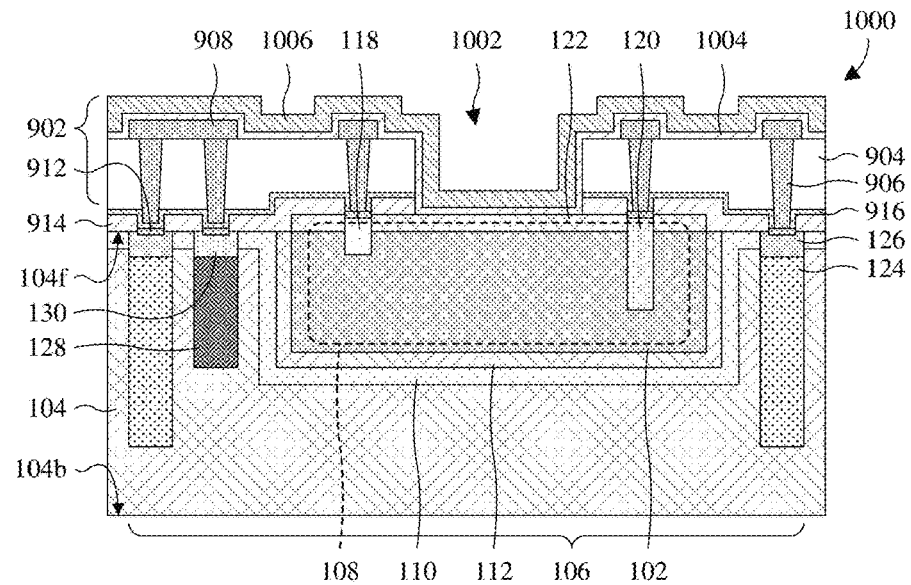
FIG. 10 illustrates a cross-sectional view of some more detailed embodiments of the image sensor of FIG. 1 in which the image sensor is FSI and further includes an interconnect structure defining a photodetector opening.

With reference to FIG. 10, a cross-sectional view 1000 of some more detailed embodiments of the image sensor of FIG. 1 is provided in which the image sensor is FSI and further includes an interconnect structure 902 defining a photodetector opening 1002. The photodetector opening 1002 overlies the photodetector 108 and provides a path for incident radiation to impinge on the photodetector 108. The interconnect structure 902 is similar to its counterparts in FIGS. 9A and 9B and hence comprises an interconnect dielectric layer 904, a plurality of contacts 906, and a plurality of wires 908 as described with regard to FIGS. 9A and 9B. However, in contrast with its counterparts in FIGS. 9A and 9B, the interconnect structure 902 has a single level of wires and omits vias. In alternative embodiments, the interconnect structure 902 may have additional levels of the wires 908 and vias 910 as in FIGS. 9A and 9B.

A first passivation layer 1004 covers the interconnect structure 902 and lines the photodetector opening 1002. Further, a second passivation layer 1006 covers the interconnect structure 902 and lines the photodetector opening 1002 over the first passivation layer 1004. The first passivation layer 1004 may, for example, be or comprise silicon oxide and/or some other suitable dielectric(s), and/or the second passivation layer 1006 may, for example, be or comprise silicon nitride and/or some other suitable dielectric(s).

While the image sensors of FIGS. 1-8, 9A, 9B, and 10 are illustrated and described with a single pixel 106, any of the image sensors may include additional pixels in some embodiments. The additional pixels may, for example, each be as the pixel 106 is illustrated and described in the corresponding image sensor. For example, FIG. 1 may have additional pixels each as the pixel 106 of FIG. 1 is illustrated and described. While FIG. 2 illustrates a top layout for the image sensor of FIG. 1, the top layout may also be applied to the image sensor in any one of FIGS. 3-8, 9A, 9B, and 10. For example, any one of FIGS. 3-8, 9A, 9B, and 10 may be taken along line A of FIG. 2. While FIGS. 3-8 illustrate variations to the image sensor of FIG. 1, these variations may be applied to the image sensor in any of FIGS. 3-8. For example, the cap layer 122 of FIG. 4 may alternatively overlie the interlayer 112 as illustrated and described at FIG. 3. While FIGS. 9A and 9B illustrate the image sensor of FIG. 1 respectively in an BSI configuration and a FSI configuration, the image sensor in any of FIGS. 3-8 may have a BSI configuration as in FIG. 9A and an FSI configuration as in FIG. 9B. While FIG. 10 illustrates the image sensor of FIG. 1 in an alternative FSI configuration, the image sensor in any of FIGS. 3-8 may have an FSI configuration as in FIG. 10.

With reference to FIGS. 11, 12A, 12B, 13-16, 17A-17C, and 18-22, a series of cross-sectional views 1100, 1200A, 1200B, 1300-1600, 1700A-1700C, 1800-2200 of some embodiments of a method for forming an image sensor is provided in which a device layer is recessed into a substrate and has high crystalline quality. The method is illustrated through formation of the image sensor of FIG. 9A. However, the method may, for example, be employed to form the image sensor in any of FIGS. 1-8, 9B, and 10 and may, for example, be employed to form other suitable image sensors.

Figure 11:
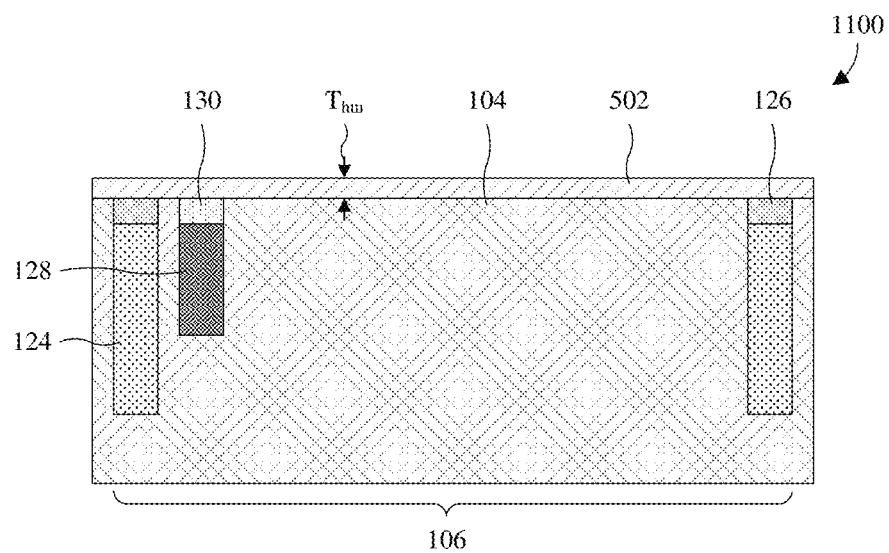
FIGS. 11, 12A, 12B, 13-16, 17A-17C, and 18-22 illustrate a series of cross-sectional views of some embodiments of a method for forming an image sensor in which a device layer is recessed into a substrate and has high crystalline quality.

As illustrated by the cross-sectional view 1100 of FIG. 11, a hard mask layer 502 is deposited over a substrate 104. In some embodiments, a thickness $T_{hm}$ of the hard mask layer 502 is about 300-2000 angstroms, about 300-1150 angstroms, about 1150-2000 angstroms, about 750 angstroms, or some other suitable value. The hard mask layer 502 may, for example, be or comprise USG and/or some other suitable dielectric(s). The substrate 104 may, for example, be or comprise crystalline silicon or some other suitable semiconductor material. In some embodiments, the substrate 104 is a bulk semiconductor substrate. Further, in some embodiments, the substrate 104 is doped with P-type dopants.

Also illustrated by the cross-sectional view 1100 of FIG. 11, a DII region 124, a SII region 126, a DSI region 128, and a SSI region 130 are formed in the substrate 104. In alternative embodiments, the DSI region 128 is omitted. The DII region 124, the SII region 126, the DSI region 128, and the SSI region 130 are doped regions of the substrate 104 and are formed by ion implantation and/or some other suitable doping process(es). In some embodiments, the ion implantation is performed through the hard mask layer 502 to prevent crystalline damage and hence leakage current in the substrate 104.

The DII region 124 and the SII region 126 are in the substrate 104 to provide electrical isolation between a pixel 106 being formed and neighboring pixels (not shown) being formed. The DII region 124 has a pair of DII segments respectively on opposite sides of the pixel 106, and the SII region 126 has a pair of SII segments respectively overlying the DII region segments. In some embodiments, the DII region 124 and the SII region 126 have top layouts as in FIG. 2, but other suitable top layouts are amenable. The DII region 124 and the SII region 126 share a doping type, but the SII region 126 has a greater doping concentration than the DII region 124. The shared doping type may, for example, be opposite to that of a bulk of the substrate 104.

The DSI region 128 and the SSI region 130 are in the substrate 104 between the DII segments of the DII region 124. In some embodiments, the DSI region 128 and the SSI region 130 have top layouts as in FIG. 2, but other suitable top layouts are amenable. The SSI region 130 overlies the DSI region 128 and shares a doping type with the DSI region 128. The shared doping type may, for example, be the same as that of a bulk of the substrate 104. Further, the SSI region 130 has a higher doping concentration than the DSI region 128 and the substrate 104.

Figure 12A:
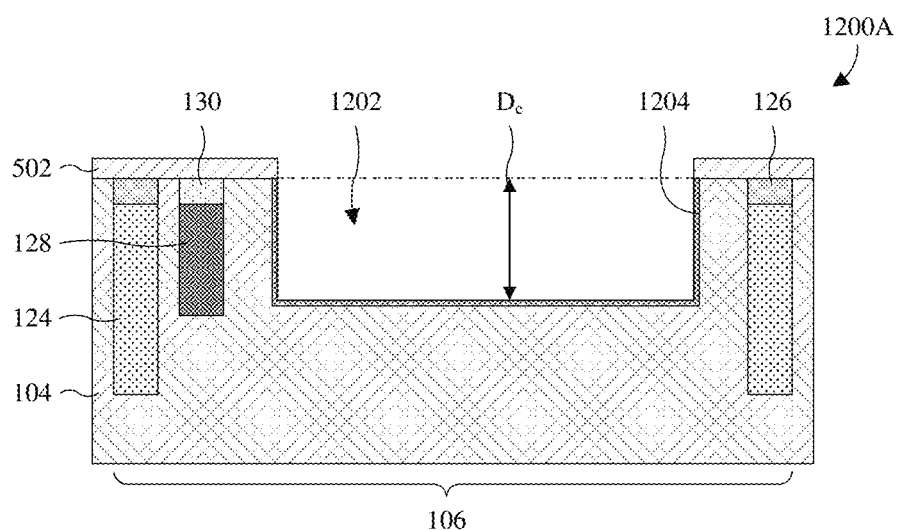
Figure 12B:
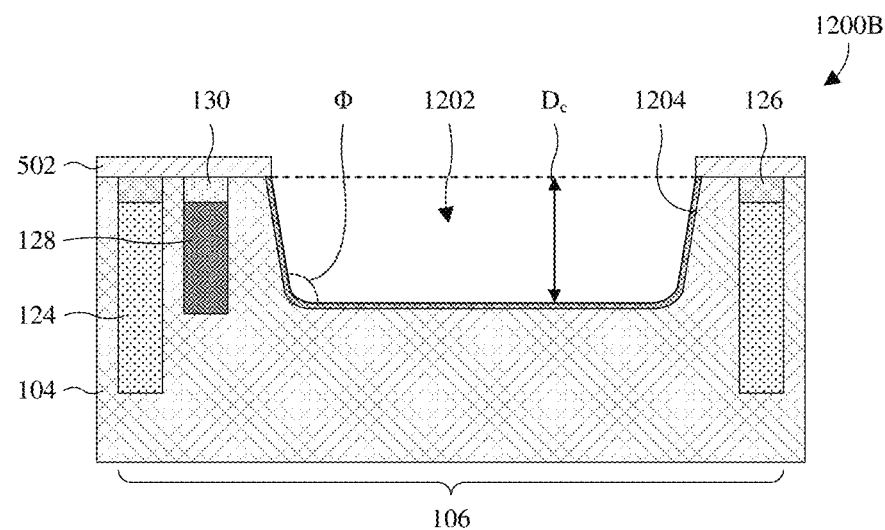

As illustrated by the cross-sectional views 1200A, 1200B of FIGS. 12A and 12B, a first etch is performed selectively into the hard mask layer 502 and the substrate 104 to form a cavity 1202 in the substrate 104. FIGS. 12A and 12B are alternative embodiments of the first etch and hence each individually illustrates the first etch. In FIG. 12A, sidewalls of the cavity 1202 are vertical and corners of the cavity 1202 are square. In FIG. 12B, the sidewalls are slanted at an angle Φ relative to a bottom surface of the cavity 1202 and the corners are rounded. The angle Φ may, for example, be about 99.4 degrees, about 100 degrees, about 95-110 degrees, or some other suitable value. In alternative embodiments, the sidewalls may have other suitable orientations and/or the corners may have other suitable profiles.

The first etch forms a layer 1204 of crystalline damage that is in the substrate 104 and that lines the cavity 1202. In some embodiments, the crystalline damage is caused by ion bombardment while etching the substrate 104. Further, the first etch forms the cavity 1202 to a depth $D_c$. In some embodiments, the depth $D_c$ is about 0.5-1.0 micrometers, about 1-2 micrometers, about 2-5 micrometers, about 5-10 micrometers, about 1.1 micrometers, or some other suitable value. If the depth $D_c$ is too small (e.g., less than about 0.5 micrometers or some other suitable value), a photodetector hereafter formed in the cavity 1202 may have poor absorption to incident radiation. If the depth $D_c$ is too large (e.g., greater than about 10 micrometers or some other suitable value), epitaxial growth hereafter performed to fill the cavity 1202 may take too long and throughput may be significantly reduced.

A process for selectively performing the first etch may, for example, comprise: 1) forming a photoresist mask (not shown) over the hard mask layer 502 using photolithography; 2) etching the hard mask layer 502 and the substrate 104 with the photoresist mask in place; and 3) removing the photoresist mask. Other suitable processes are, however, amenable. In some embodiments, the etching is performed by dry etching using ion bombardment. In alternative embodiments, the etching is performed using some other suitable type of etching. The removing may, for example, be performed by applying a cleaning solution comprising peroxymonosulfuric acid (e.g., Caro's acid) to the photoresist mask or by some other suitable removal process.

Figure 13:
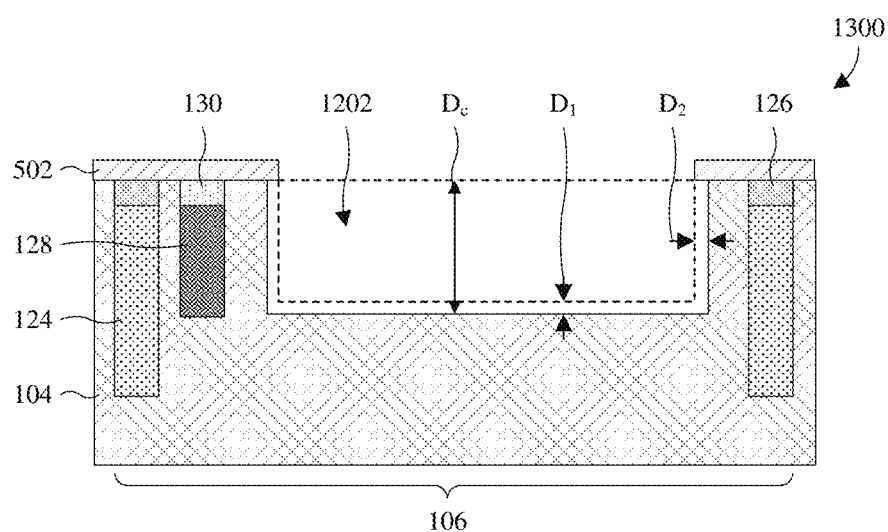

As illustrated by the cross-sectional view 1300 of FIG. 13, a second etch is performed into the substrate 104 to remove the layer 1204 of crystalline damage (see, e.g., FIG. 12). The second etch may be performed into the substrate 104 in either of FIGS. 12A and 12B but is illustrated using the substrate 104 in FIG. 12A. As noted above, FIGS. 12A and 12B are alternatives of each other. The second etch is performed using an etchant that does not, or minimally damages, the substrate 104 and that has a higher selectivity for the substrate 104 than the hard mask layer 502. Further, the second etch both vertically and laterally etches the substrate 104.

By vertically etching the substrate 104, the second etch removes crystalline damage along a bottom surface of the cavity 1202 and increases the depth $D_c$ of the cavity 1202 by a first distance $D_1$. For example, the second etch may increase the depth $D_c$ from about 1.1 micrometers to about 1.2 micrometers. Other suitable values are, however, amenable. In some embodiments, the depth $D_c$ is about 0.5-1.0 micrometers, about 1.1 micrometers, about 1-2 micrometers, about 2-5 micrometers, about 5-10 micrometers, or some other suitable value after the second etch. By laterally etching the substrate 104, the second etch removes crystalline damage along sidewalls of the substrate 104 in the cavity 1202. Further, the second etch recesses the sidewalls of the substrate 104 by a second distance $D_2$ relative to neighboring sidewalls of the hard mask layer 502 in the cavity 1202. Hence, the hard mask layer 502 overhangs the cavity 1202.

In some embodiments, the first and second distances $D_1$, $D_2$ are the same or about the same. In some embodiments the first distance $D_1$ and/or the second distance $D_2$ is/are about 430-1000 angstroms, about 250-2000 angstroms, about 500 angstroms, about 800 angstroms, or some other suitable amount. If the first and second distances $D_1$, $D_2$ are too small (e.g., less than about 250 angstroms or some other suitable value), the second etch may fail to fully remove the layer 1204 of crystalline damage. Further, if the second distance $D_2$ is too small (e.g., less than about 250 angstroms or some other suitable value), edge bumps along a top surface of a device layer hereafter formed in the cavity 1202 may be large. As described below, this increase loading during a planarization process and reduces throughput. If the first distance $D_1$ is too large (e.g., more than about 2000 angstroms or some other suitable value), the depth $D_c$ may be too large and epitaxial growth hereafter performed to fill the cavity 1202 may significantly reduce throughput. Further, if the second distance $D_2$ is too large (e.g., more than about 2000 angstroms or some other suitable value), the hard mask layer 502 may collapse into the cavity 1202.

The second etch may, for example, etch by chemical reaction and/or without dependence on ion bombardment. Ion bombardment may, for example, cause additional crystalline damage along surfaces of the substrate 104 in the cavity 1202. The second etch may, for example, be performed by CDE, wet etching, or some other suitable type of etching. Compared to wet etching, it has been appreciated that CDE may remove the layer 1204 of crystalline damage at a faster rate than the wet etch and may hence have higher throughput.

Because the second etch removes crystalline damage along surfaces of the substrate 104 in the cavity 1202, crystalline quality of the substrate 104 is higher at the surfaces. Because of the higher crystalline quality, leakage current along the surfaces may be reduced. This may, in turn, enhance performance a photodetector hereafter formed in the cavity 1202. Further, because of the higher crystalline quality, epitaxial growth hereafter performed to fill the cavity 1202 may form epitaxial layers with higher quality. This may further reduce leakage current and may further enhance performance of the photodetector.

Figure 14:
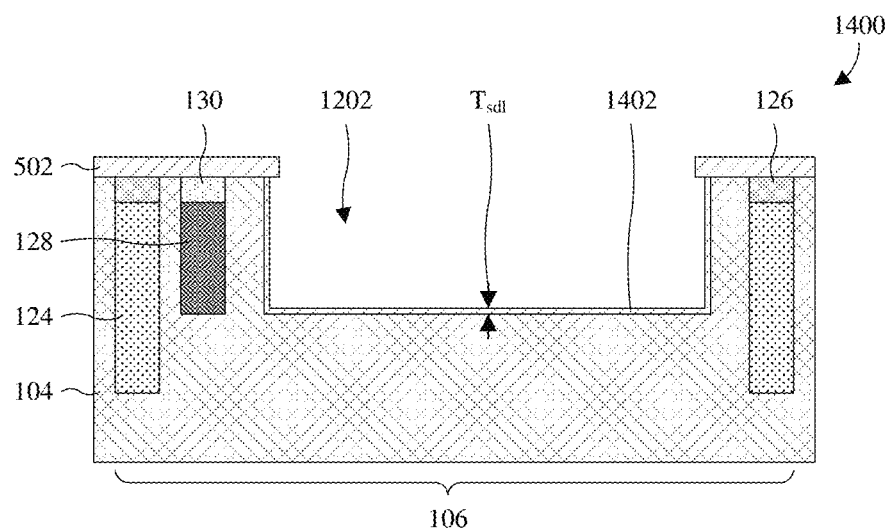

As illustrated by the cross-sectional view 1400 of FIG. 14, a sacrificial dielectric layer 1402 is deposited lining surfaces of the substrate 104 in the cavity 1202. As seen hereafter, the sacrificial dielectric layer 1402 may prevent crystalline damage to the substrate 104 during ion implantation. The sacrificial dielectric layer 1402 may, for example, be or comprise silicon oxide and/or some other suitable dielectric (s). Further, the sacrificial dielectric layer 1402 may, for example, be deposited by thermal oxidation or some other suitable deposition process.

In some embodiments, the sacrificial dielectric layer 1402 is deposited with a thickness $T_{sdl}$ of about 50-150 angstroms, about 50-100 angstroms, about 100-150 angstroms, about 90 angstroms, or some other suitable value. If thickness $T_{sdl}$ is too small (e.g., less than about 50 angstroms or some other suitable value), the sacrificial dielectric layer 1402 may not prevent crystalline damage to the substrate 104 during subsequent ion implantation. If the thickness $T_{sdl}$ is too large (e.g., more than about 150 angstroms or some other suitable value), the sacrificial dielectric layer 1402 may limit or otherwise prevent subsequent ion implantation.

In some embodiments, a first cleaning process is performed between the second etch and the deposition of the sacrificial dielectric layer 1402 so surfaces of the substrate 104 in the cavity 1202 are clean for the deposition of the sacrificial dielectric layer 1402. The first cleaning processes may, for example, remove etch residue, native oxide, other errant particles, or any combination of the foregoing from surfaces of the substrate 104 in the cavity 1202. The first cleaning process may, for example, be performed by applying a dilute hydrofluoric acid (DHF) cleaning solution to the substrate 104 or by some other suitable cleaning process.

Figure 15:
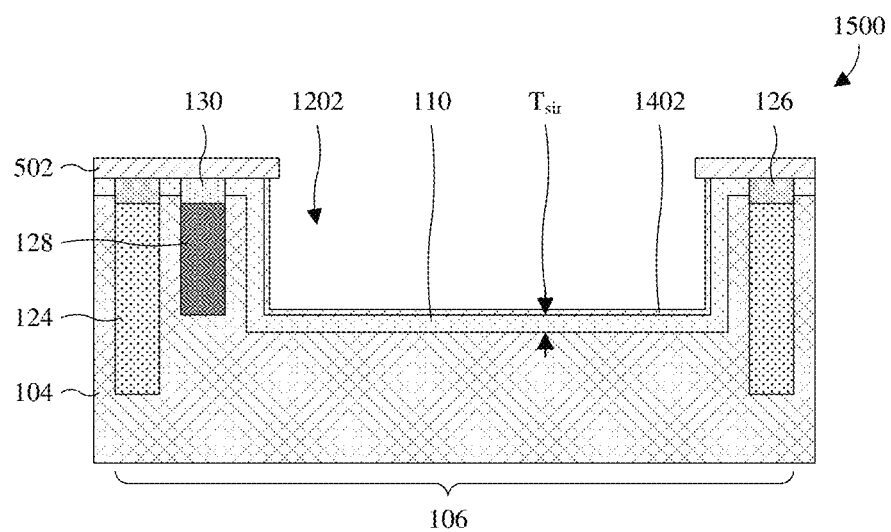

As illustrated by the cross-sectional view 1500 of FIG. 15, a substrate implant region 110 is formed lining the cavity 1202 through the sacrificial dielectric layer 1402 and the hard mask layer 502. In some embodiments, the substrate implant region 110 has the same doping type as, but a higher doping concentration than, a bulk of the substrate 104. In some embodiments, the substrate implant region 110 is P-type and/or has a doping concentration between about 1e17-5e18 atoms/cm3. Other suitable doping types and/or other suitable doping concentrations are, however, amenable. In some embodiments, the substrate implant region 110 has a thickness $T_{sir}$ that is uniform or substantially uniform throughout.

A process for forming the substrate implant region 110 may, for example, comprise: 1) performing a blanket ion implantation through the sacrificial dielectric layer 1402 and the hard mask layer 502 to implant dopants into the substrate 104; and 2) performing an anneal to activate the dopants. Other suitable processes are, however, amenable.

By performing the blanket ion implantation through the sacrificial dielectric layer 1402 and the hard mask layer 502, crystalline damage to the substrate 104 may be reduced or otherwise prevented. As such, surfaces of the substrate 104 along which the substrate implant region 110 is arranged have fewer crystalline defects and higher crystalline quality. This leads to reduced leakage current along the surfaces and enhances performance of a photodetector hereafter formed in the cavity 1202. Further, epitaxial growth hereafter performed to fill the cavity 1202 may form epitaxial layers with higher quality. This further reduces leakage current and further enhances performance of the photodetector hereafter formed.

Figure 16:
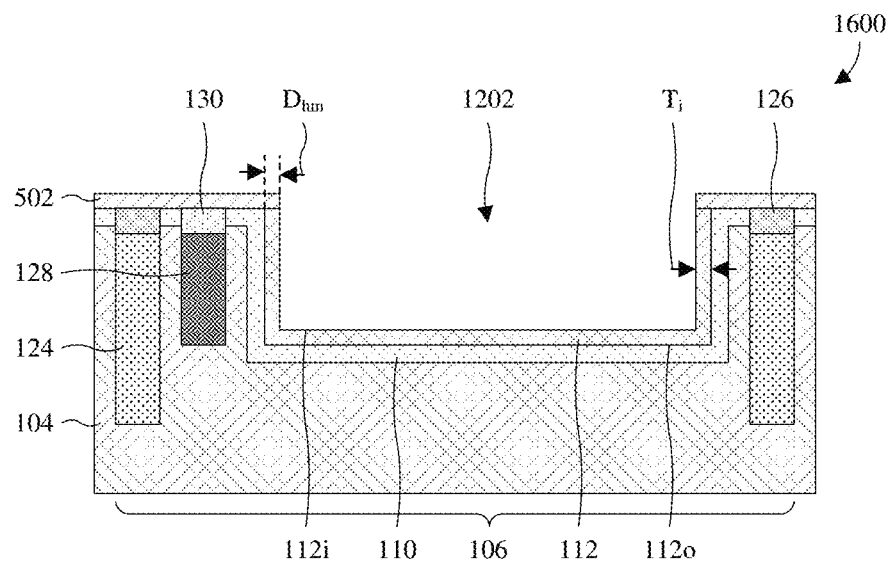

As illustrated by the cross-sectional view 1600 of FIG. 16, the sacrificial dielectric layer 1402 is removed. The removal may, for example, be performed as part of a second cleaning process. The second cleaning processes may, for example, remove etch residue, native oxide, other errant particles, or any combination of the foregoing from surfaces of the substrate 104 in the cavity 1202. The second cleaning process may, for example, be performed by applying a DHF cleaning solution to the substrate 104 or by some other suitable cleaning process.

Also illustrated by the cross-sectional view 1600 of FIG. 16, an interlayer 112 is epitaxially grown lining the cavity 1202 over the substrate implant region 110. The interlayer 112 is epitaxially grown from the substrate 104 and is hence grows on exposed surfaces of the substrate 104 in the cavity 1202. The interlayer 112 is or comprises the same semiconductor material as the substrate 104 and is undoped or lightly doped. The light doping may, for example, have a doping concentration less than about 1e15 atoms per cubic centimeter or some other suitable value. Further, the interlayer 112 has a high resistance from an inner surface 112i of the interlayer 112 to an outer surface 112o of the interlayer 112. The high resistance may, for example, be a resistance greater than about 100 kiloohms or some other suitable value. The high resistance may, for example, result from a thickness $T_i$ of the interlayer 112 and/or a doping concentration of the interlayer 112. For example, resistance of the interlayer 112 may be proportional to the thickness $T_i$ and/or inversely proportional to a doping concentration of the interlayer 112.

The high resistance reduces leakage current from the substrate 104 to a device layer hereafter formed filling the cavity 1202. By reducing such leakage current, inter-pixel leakage current is reduced and performance of a photodetector hereafter formed in the device layer is reduced. Further, the interlayer 112 blocks dopants from the substrate implant region 110 from diffusing to the device layer hereafter formed. Dopants that diffuse to the device layer may create a low resistance region from the substrate 104 to the device layer and may hence increases inter-pixel leakage current. Because the interlayer 112 blocks the diffusion, the resistance from the substrate 104 to the device layer may remain high.

The thickness $T_i$ of the interlayer 112 may, for example, be about 430-1000 angstroms, about 430-715 angstroms, about 715-1000 angstroms, about 250-2000 angstroms, or some other suitable value. If the thickness $T_i$ is too low (e.g., less than about 250 angstroms or some other suitable value), the interlayer 112 may be unable to block diffusion of dopants from the substrate implant region 110 to the device layer and/or the resistance between the substrate 104 and the device layer may be low. As a result, leakage current may be high between the substrate 104 and the device layer and may negatively impact performance of the photodetector. If the thickness $T_i$ is too high (e.g., greater than about 2000 angstroms or some other suitable value), the interlayer 112 may take a long time to epitaxially grow and may impact throughout.

In some embodiments, the thickness $T_i$ of the interlayer 112 is the same as or about the same as a distance $D_{hm}$ with which sidewalls of the hard mask layer 502 in the cavity 1202 are offset from neighboring sidewalls of the substrate 104. In at least some of such embodiments, the interlayer 112 and the hard mask layer 502 define a common sidewall. If the thickness $T_i$ is greater than the distance $D_{hm}$, a top surface of the interlayer 112 may be partially uncovered by the hard mask layer 502. As a result, a device layer epitaxially grown hereafter in the cavity 1202 may grow from the top surface of the interlayer 112 and hence humps that form at a periphery of the device layer may be larger. The larger humps may increase loading while hereafter performing a planarization to flatten a top surface of the device layer. Because of the increased loading, the planarization may take longer to complete and throughput may be negatively impacted. If the thickness $T_i$ is less than the distance $D_{hm}$, the device layer hereafter formed in the cavity 1202 may partially underlie the hard mask layer 502. As a result, the hard mask layer 502 may prevent a cap layer hereafter grown epitaxially on the device layer from fully covering the device layer. The cap layer protects the device layer during subsequent processing, such that the uncovered portion of the device layer may be more susceptible to damage.

Figure 17A:
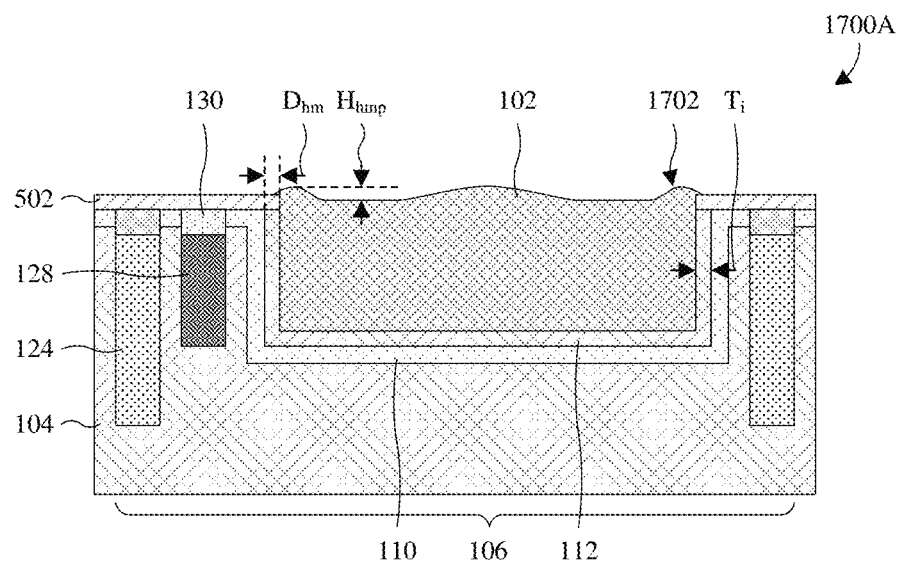
Figure 17B:
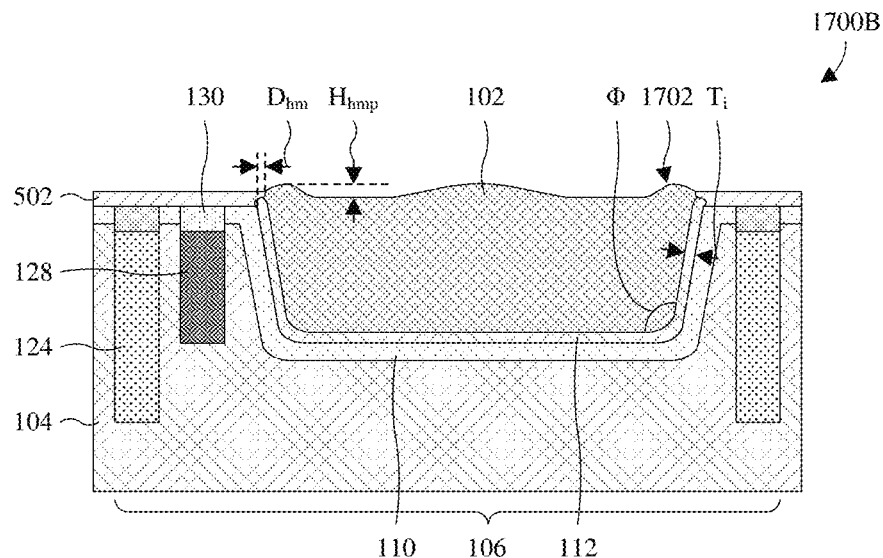
Figure 17C:
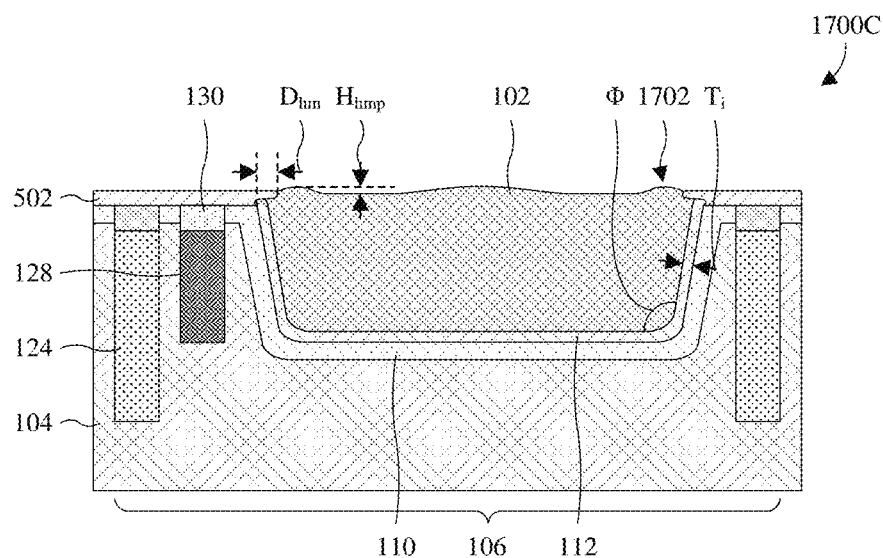

As illustrated by the cross-sectional views 1700A-1700C of FIGS. 17A-17C, a device layer 102 is epitaxially grown filling the cavity 1202 (see, e.g., FIG. 16). FIGS. 17A-17C are alternative embodiments of the epitaxial growth and hence each individually illustrates the epitaxial growth. In FIG. 17A, sidewalls of the cavity 1202 are vertical and corners of the cavity 1202 are square. In FIGS. 17B and 17C, the sidewalls are slanted at an angle Φ relative to a bottom surface of the cavity 1202 and the corners are rounded. Further, the distance $D_{hm}$ with which sidewalls of the hard mask layer 502 in the cavity 1202 are offset from neighboring sidewalls of the substrate 104 is varied. This may, for example, be controlled by the duration of the second etch at FIG. 13. In alternative embodiments, constituents (e.g., the interlayer 112, the hard mask layer 502, etc.) of the image sensor may have other suitable profiles.

The device layer 102 is epitaxially grown from the interlayer 112 and is hence grows on surfaces of the interlayer 112 in the cavity 1202. The device layer 102 is a different semiconductor material than the substrate 104 and the interlayer 112. For example, the device layer 102 may be germanium or silicon germanium, whereas the substrate 104 and the interlayer 112 may be silicon. Other suitable materials are, however, amenable. In some embodiments, the device layer 102 has a higher absorption coefficient for NIR and/or IR radiation than the substrate 104 and the interlayer 112. In some embodiments, the device layer 102 has a smaller bandgap than the substrate 104 and the interlayer 112. In some embodiments, the device layer 102 has a bandgap less than about 1.0 electron volt or some other suitable value. Further, the device layer 102 has humps 1702 at a periphery of the device layer 102. The humps 1702 may, for example, form due to thermal processing during and/or after the epitaxial growth of the device layer 102. Such thermal processing exposes the device layer 102 to high temperatures that cause the device layer 102 to reflow and form the humps 1702. The high temperature may, for example, be temperatures in excess of about 650 degrees Celsius, about 850 degrees Celsius, or some other suitable value. In some embodiments, the humps 1702 have a height $H_{hmp}$ that is about 500-3000 angstroms, about 500-1750 angstroms, about 1750-3000 angstroms, or some other suitable value. The height $H_{hmp}$ may, for example, be relative to a point on a lowest point on a top surface of the device layer 102.

The hard mask layer 502 serves as a barrier to block the device layer 102 from flowing out of the cavity 1202. Further, a portion of the hard mask layer 502 that overlies the interlayer 112 may reduce the height $H_{hmp}$ of the humps 1702 by, for example, preventing or otherwise reducing epitaxial growth of the device layer 102 from a top surface of the interlayer 112. For example, the height $H_{hmp}$ may be reduced by about 500 angstroms or by some other suitable value. In some embodiments, the greater the ratio between the distance $D_{hm}$ and the thickness $T_i$, the greater the reduction. This is illustrated with FIGS. 17B and 17C. Because the ratio between the distance $D_{hm}$ and the thickness $T_i$ is greater in FIG. 17C than in FIG. 17B, the height $H_{hmp}$ is smaller in FIG. 17C than in FIG. 17B. As above, the distance $D_{hm}$ is the distance with which sidewalls of the hard mask layer 502 in the cavity 1202 are offset from neighboring sidewalls of the substrate 104. Further, the thickness $T_i$ is the thickness of the interlayer 112.

By reducing the height $H_{hmp}$ of the humps 1702, loading during a subsequent planarization to flatten a top surface of the device layer 102 is reduced. For example, where the planarization is performed by a chemical mechanical polish (CMP), CMP loading may be reduced. By reducing the loading, the planarization may be performed more quickly. This, in turn, allows increased throughput and reduced costs.

In some embodiments, the ratio between the distance $D_{hm}$ and the thickness $T_i$ is about 1:1 to 5:1, about 1:1 to 2.5:1, about 2.5:1 to 5:1, or some other suitable value. If the ratio is too low (e.g., less than about 1:1 or some other suitable value), the height $H_{hmp}$ of the humps 1702 may be large. As described above, this may increase loading during a planarization hereafter performed to flatten the device layer 102. If the ratio is too high (e.g., greater than about 5:1 or some other suitable value), the hard mask layer 502 may collapse into the cavity 1202.

Figure 18:
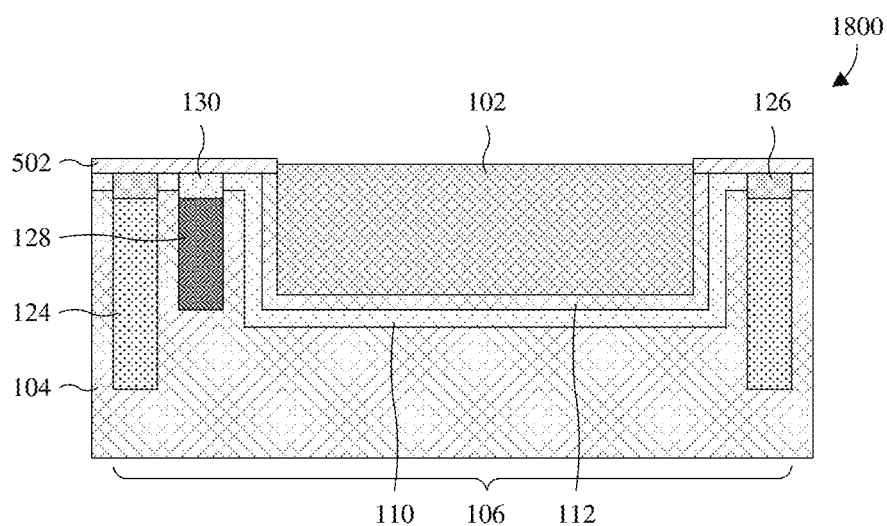

As illustrated by the cross-sectional view 1800 of FIG. 18, a planarization is performed into a top surface of the device layer 102 to flatten the top surface and to wholly or substantially remove the humps 1702 (see, e.g., FIGS. 17A-17C). The planarization may be performed into the device layer 102 in any of FIGS. 17A-17C but is illustrated using the device layer 102 in FIG. 17A. As noted above, FIGS. 17A-17C are alternatives of each other. Flattening the top surface of the device layer 102 improves uniformity and hence reliability with processing performed hereafter. For example, the flattening may improve uniformity and reliability while forming a cap layer, an interconnect structure, and other suitable features hereafter described. The planarization may, for example, be performed by a CMP or some other suitable process.

Because the second etch (see, e.g., FIG. 13) recesses sidewalls of the substrate 104 in the cavity 1202 (see, e.g., FIG. 15), the hard mask layer 502 may partially or wholly cover a top surface of the interlayer 112. As a result, epitaxial growth from the top surface of the interlayer 112 is prevented or otherwise reduced while forming the device layer 102. This, in turn, may reduce the height $H_{hmp}$ of humps 1702 (see, e.g., FIGS. 17A-17C) that formed at a periphery of the device layer 102. Because the height $H_{hmp}$ may be reduced, loading during the planarization may be reduced. This may increase the speed of the planarization and may hence increase throughput and reduce costs. For example, planarization time may be reduced by about 60 seconds or some other suitable value.

Figure 19:
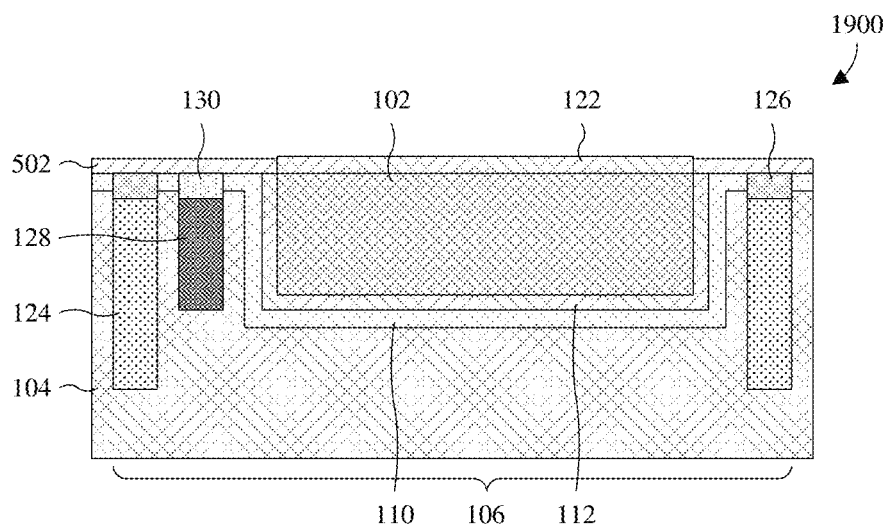

As illustrated by the cross-sectional view 1900 of FIG. 19, a cap layer 122 is epitaxially grown on and covering the device layer 102. The cap layer 122 is a different semiconductor material than the device layer 102 and may, for example, be or comprise silicon or some other suitable semiconductor material. In some embodiments, the cap layer 122 is the same semiconductor material as the interlayer 112 and/or the substrate 104. Further, in some embodiments, the cap layer 122 is undoped.

The cap layer 122 is epitaxially grown, such that the cap layer 122 grows on the device layer 102 but not on the hard mask layer 502. As such, the cap layer 122 is localized to the device layer 102 by a self-aligned process that does not depend upon photolithography. Because photolithography is costly, forming the cap layer 122 by a self-aligned process reduces costs.

The cap layer 122 protects the device layer 102 from damage during subsequent processing. For example, subsequent wet cleaning processes may use acids that have high etch rates for the device layer 102 but low etch rates for the cap layer 122. As such, the device layer 102 would undergo significant crystalline damage and/or erosion if directly exposed to the acids whereas the cap layer 122 would not. Such crystalline damage would increase leakage current and hence degrade SNR, QE, and other suitable performance metrics for a photodetector hereafter formed in the device layer 102. Therefore, by preventing the device layer 102 from coming into direct contact with the acids, the cap layer 122 protects the device layer 102. This, in turn, reduces leakage current and enhances performance of the photodetector.

Figure 20:
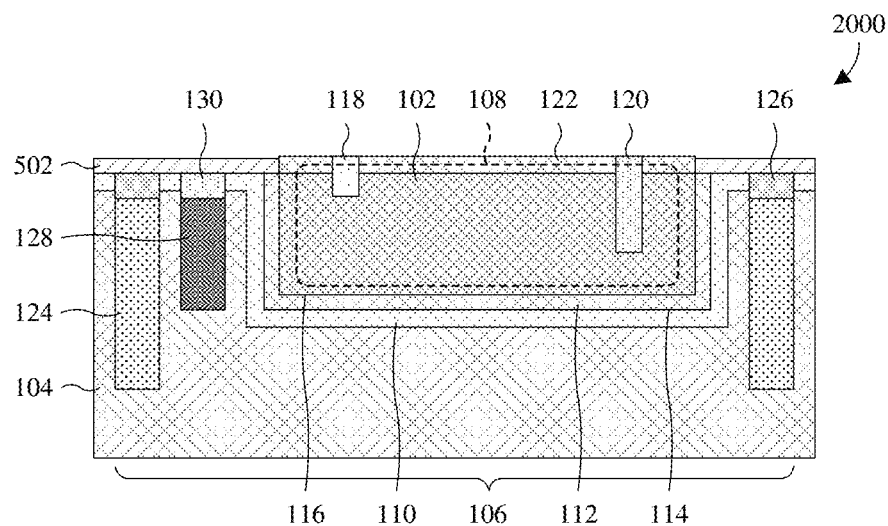

As illustrated by the cross-sectional view 2000 of FIG. 20, a photodetector 108 is formed in the device layer 102 and includes a first contact region 118 and a second contact region 120. The first and second contact regions 118, 120 are doped semiconductor regions in the device layer 102 and may be formed by ion implantation and/or some other suitable doping process. The first contact region 118 has a first doping type, and the second contact region 120 has a second doping type opposite the first doping type. The first and second doping types may, for example, respectively be N-type and P-type or vice versa. The bulk of the device layer 102 may, for example, be undoped. The photodetector 108 may, for example, be or comprise a PIN photodiode or some other suitable type of photodiode.

Because the second etch (see, e.g., FIG. 13) removes the crystalline damage from the first etch (see, e.g., FIGS. 12A and 12B), crystalline defects at a first interface 114 between the substrate 104 and the interlayer 112 are reduced. As a result, the interlayer 112 and the device layer 102 may be epitaxially grown (see, e.g., FIGS. 16 and 17A-17C) with higher crystalline quality. Further, crystalline defects at a second interface 116 between the interlayer 112 and the device layer 102 may be reduced. The reduced crystalline defects and the higher crystalline quality reduce leakage current and improve performance of the photodetector 108.

Because the substrate implant region 110 is formed (see, e.g., FIG. 15) through sacrificial dielectric layer 1402, crystalline damage to the substrate 104 at the first interface 114 may be prevented or otherwise reduced. For example, when the substrate implant region 110 is formed by ion implantation, crystalline damage from ion bombardment may be prevented or otherwise reduced. As a result, the interlayer 112 and the device layer 102 may be epitaxially grown with higher crystalline quality. Further, crystalline defects at the second interface 116 may be reduced. The reduced crystalline defects and the higher crystalline quality reduce leakage current and improve performance of the photodetector 108.

Because the device layer 102 is a different semiconductor material than the interlayer 112 and the substrate 104, different lattice constants and/or different coefficients of thermal expansion may lead to threading-dislocation defects along the interlayer 112. The substrate implant region 110 reduces carriers induced by the crystalline defects and hence reduces leakage current along the interlayer 112. Because the substrate implant region 110 reduces leakage current, the substrate implant region 110 may enhance performance of the photodetector 108.

As noted above, the interlayer 112 may have a high resistance. As such, the interlayer 112 may reduce leakage current from the device layer 102 to the substrate 104. By reducing such leakage current, inter-pixel leakage current may be reduced and performance of the photodetector 108 may be increased. Additionally, the interlayer 112 blocks dopants from the substrate implant region 110 from diffusing to the device layer 102. Dopants that diffuse to the device layer 102 may create a low resistance region from the substrate 104 to the device layer 102 and may hence increases inter-pixel leakage current. Because the interlayer 112 blocks the diffusion, the resistance from the substrate 104 to the device layer 102 may remain high.

Figure 21:
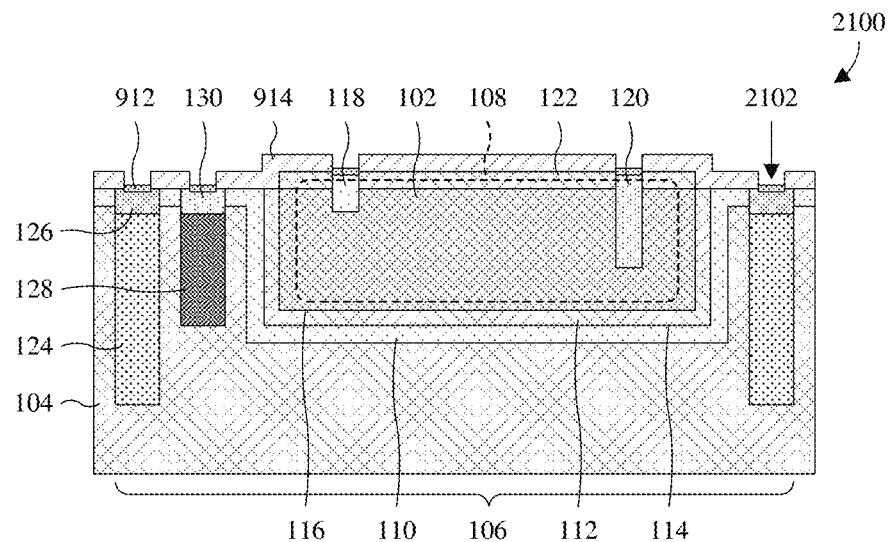

As illustrated by the cross-sectional view 2100 of FIG. 21, the hard mask layer 502 (see, e.g., FIG. 20) is removed. The removal may, for example, be performed by an etching process or some other suitable removal process. In alternative embodiments, the hard mask layer 502 is not removed and persists hereafter.

Also illustrated by the cross-sectional view 2100 of FIG. 21, silicide layers 912 and an RPD layer 914 are formed. The RPD layer 914 defines silicide openings 2102 respectively overlying the first and second contact regions 118, 120, the SII region 126, and the SSI region 130. The silicide layers 912 are respectively in the silicide openings 2102 and may, for example, be or comprise nickel silicide or some other suitable type of metal silicide. A process for forming the silicide layers 912 and the RPD layer 914 may, for example, comprise: 1) depositing the RPD layer 914; 2) patterning the RPD layer 914 to define the silicide openings 2102; 3) depositing metal covering the RPD layer 914 and lining the silicide openings 2102; 4) annealing the metal to trigger a silicide reaction that forms the silicide layers 912; and 5) removing unreacted metal. Other suitable processes are, however, amenable. The patterning may, for example, be performed by a photolithography/etching process or some other suitable patterning process.

Because the cap layer 122 covers the device layer 102, the cap layer 122 may protect the device layer 102 from the patterning of the RPD layer 914 and/or the removal of unreacted metal. For example, the removal may be performed with a wet cleaning solution comprising an ammonia-peroxide mixture (APM), a sulfuric acid and hydrogen peroxide mixture (SPM), or some other suitable mixture comprising hydrogen peroxide (e.g., $H_2O_2$). In at least some embodiments in which the device layer 102 is or comprise germanium and the cap layer 122 is or comprises silicon, the hydrogen peroxide may have high etch rate for the device layer 102 and a low etch rate for the cap layer 122. Therefore, the device layer 102 may be more susceptible to damage from the hydrogen peroxide than the cap layer 122. If the hydrogen peroxide were to come into contact with the device layer 102 (e.g., through one of the silicide openings 2102), the device layer 102 may undergo significant erosion and hence damage. However, the cap layer 122, which is less susceptible to damage from the hydrogen peroxide, covers the device layer 102 and prevents the device layer 102 from coming into contact with the hydrogen peroxide. As such, the cap layer 122 protects the device layer 102 from the hydrogen peroxide.

Figure 22:
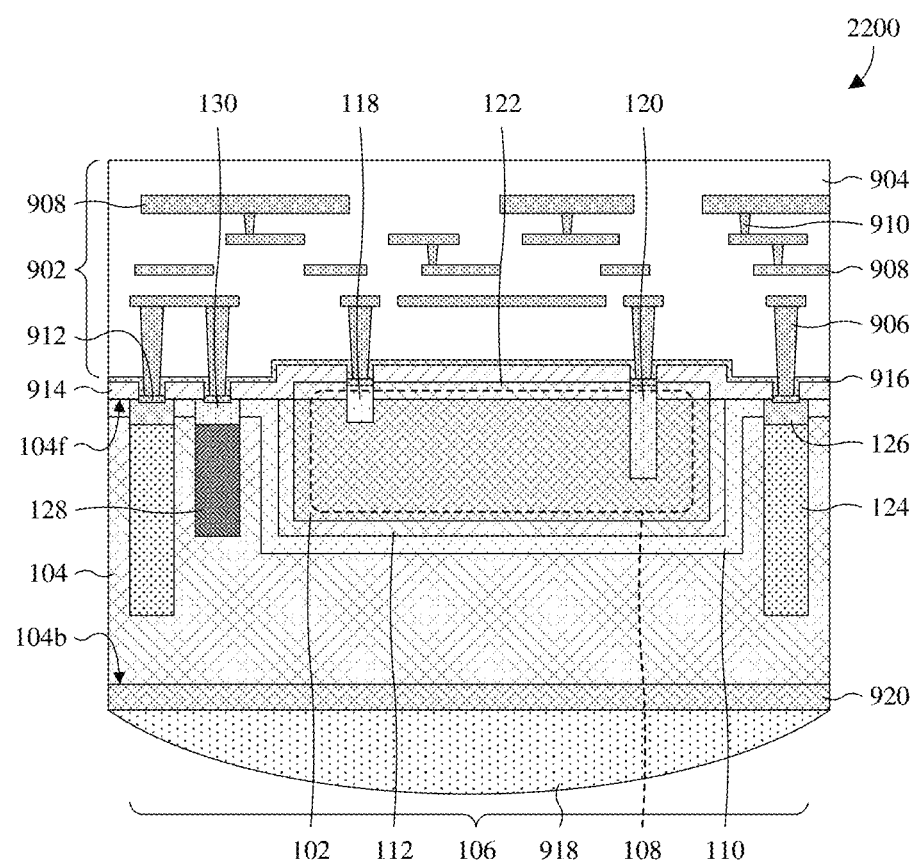

As illustrated by the cross-sectional view 2200 of FIG. 22, an interconnect structure 902 is formed over and electrically coupled to the photodetector 108 on a front side 104*f* of the substrate 104. Further, a micro lens 918 and an antireflective layer 920 are formed on a back side 104*b* of the substrate 104. The interconnect structure 902 is separated from the RPD layer 914 by a CESL 916. Further, the interconnect structure 902 is electrically coupled to the first and second contact regions 118, 120, the SII region 126, and the SSI region 130 through the silicide layers 912. The interconnect structure 902 may, for example, be as described with regard to FIG. 9A.

While FIGS. 11, 12A, 12B, 13-16, 17A-17C, and 18-22 are described with reference to various embodiments of a method, it will be appreciated that the structures shown in FIGS. 11, 12A, 12B, 13-16, 17A-17C, and 18-22 are not limited to the method but rather may stand alone separate of the method. While FIGS. 11, 12A, 12B, 13-16, 17A-17C, and 18-22 are described as a series of acts, it will be appreciated that the order of the acts may be altered in other embodiments. While FIGS. 11, 12A, 12B, 13-16, 17A-17C, and 18-22 illustrate and describe as a specific set of acts, some acts that are illustrated and/or described may be omitted in other embodiments. Further, acts that are not illustrated and/or described may be included in other embodiments.

In alternative embodiments, the acts at FIGS. 14 and 15 (e.g., formation of the substrate implant region 110) are omitted to form the image sensor in FIG. 4 or to form other suitable image sensors. In alternative embodiments, the removal of the hard mask layer 502 at FIG. 21 is omitted to form the image sensors at any of FIGS. 5-7 or to form other suitable image sensors. In alternative embodiments, the micro lens 918 and the antireflective layer 920 are formed on the front side 104*f* of the substrate 104, and the interconnect structure 902 is formed as in FIG. 9B, to from the image sensor in FIG. 9B or to form other suitable image sensors. In alternative embodiments, the interconnect structure 902 is formed as in FIG. 10, and the micro lens 918 and the antireflective layer 920 are omitted, to form the image sensor in FIG. 10 or to form other suitable image sensors.

Figure 23:
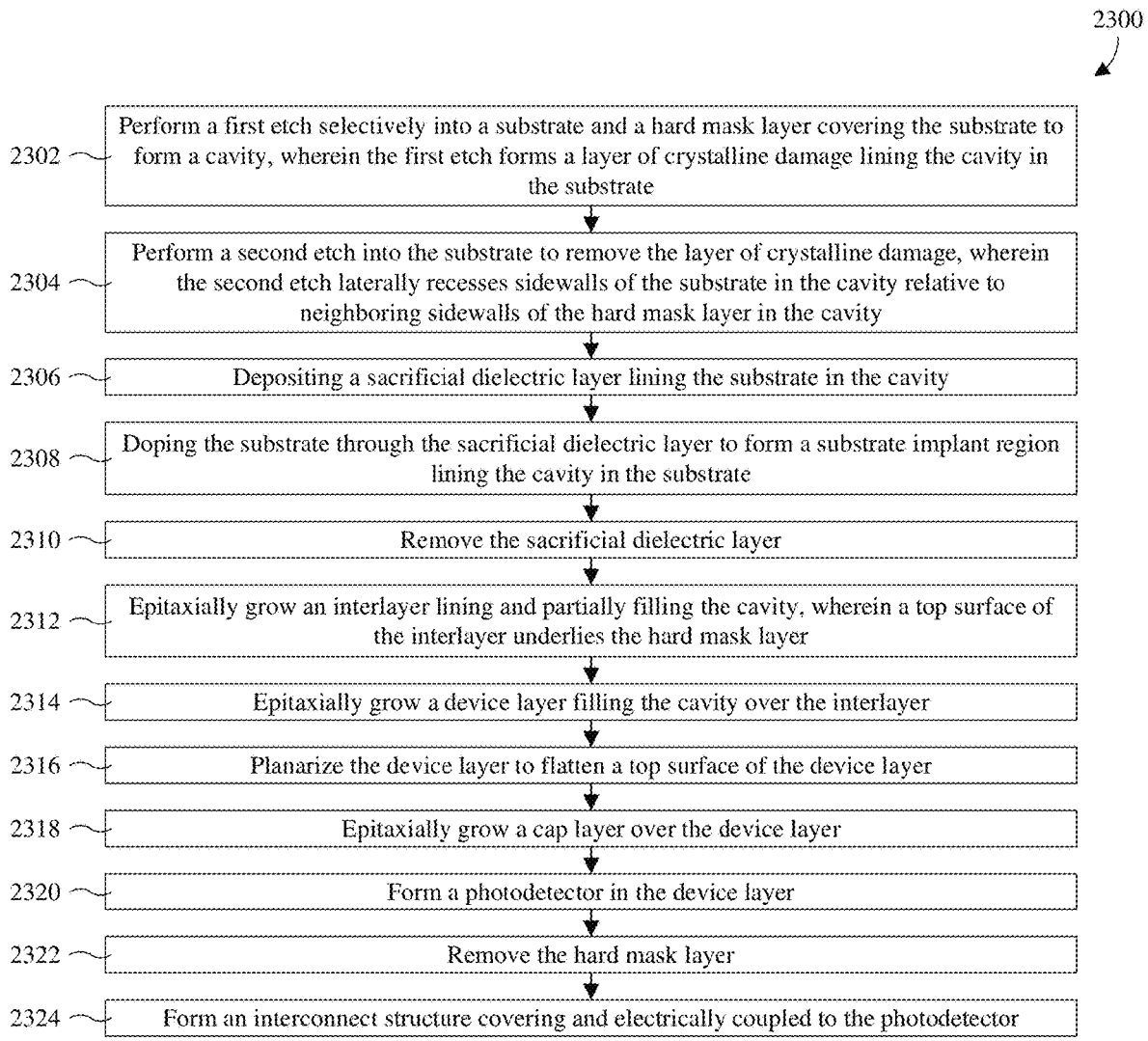
FIG. 23 illustrates a block diagram of the method of FIGS. 11, 12A, 12B, 13-16, 17A-17C, and 18-22.

With reference to FIG. 23, a block diagram 2300 of some embodiments of the method of FIGS. 11, 12A, 12B, 13-16, 17A-17C, and 18-22 is provided.

At 2302, a first etch is performed selectively into a substrate and a hard mask layer covering the substrate to form a cavity, wherein the first etch forms a layer of crystalline damage lining the cavity in the substrate. See, for example, FIGS. 11, 12A, and 12B. The first etch may, for example, be performed using dry etching or some other suitable type of etching.

At 2304, a second etch is performed into the substrate to remove the layer of crystalline damage, wherein the second etch laterally recesses sidewalls of the substrate in the cavity relative to neighboring sidewalls of the hard mask layer in the cavity. See, for example, FIG. 13. The second etch may, for example, be performed by CDE, wet etching, or some other suitable type of etching.

At 2306, a sacrificial dielectric layer is deposited lining the substrate in the cavity. See, for example, FIG. 14. The sacrificial dielectric layer may, for example, be formed by thermal oxidation or some other suitable deposition process.

At 2308, the substrate is doped through the sacrificial dielectric layer to form a substrate implant region lining the cavity in the substrate. See, for example, FIG. 15. The doping may, for example, be performed by ion implantation or some other suitable doping process. Because the doping is performed through the sacrificial dielectric layer, crystalline damage to the substrate from the doping may be avoided.

At 2310, the sacrificial dielectric layer is removed. See, for example, FIG. 16.

At 2312, an interlayer is epitaxially grown lining and partially filling the cavity, wherein a top surface of the interlayer underlies the hard mask layer. See, for example, FIG. 16.

At 2314, a device layer is epitaxially grown filling the cavity over the interlayer. See, for example, FIGS. 17A-17C.

At 2316, the device layer is planarized to flatten a top surface of the device layer. See, for example, FIG. 18. Because the top surface of the interlayer underlies the hard mask layer, epitaxial growth from the top surface is limited while forming the device layer. As a result, humps that form along a periphery of the device layer have reduced heights. This reduces loading during the planarization and increases throughput.

At 2318, a cap layer is epitaxially grown over the device layer. See, for example, FIG. 19.

At 2320, a photodetector is formed in the device layer. See, for example, FIG. 20. Because the second etch removes the crystalline damage and the sacrificial dielectric layer prevents crystalline damage at surfaces of the substrate in the cavity, the interlayer and the device layer epitaxially grow with high crystalline quality. The high crystalline quality reduces leakage current and enhances performance of the photodetector.

At 2322, the hard mask layer is removed. See, for example, FIG. 21.

At 2324, an interconnect structure is formed covering and electrically coupled to the photodetector. See, for example, FIGS. 21 and 22.

While the block diagram 2300 of FIG. 23 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present disclosure provides an image sensor including: a substrate; a device layer overlying the substrate and inset into the substrate, wherein the substrate includes a doped region that wraps around a bottom of the device layer and further extends along a sidewall of the device layer and a bottom surface of the device layer; a photodetector in the device layer; and an interlayer separating the device layer from the substrate, wherein the interlayer is on the sidewall of the device layer and the bottom surface of the device layer; wherein the substrate and the interlayer are a different semiconductor material than the device layer, and wherein the interlayer has a lesser doping concentration than the doped region. In some embodiments, the substrate and the interlayer include silicon, wherein the device layer include germanium. In some embodiments, the substrate and the interlayer have a larger bandgap than the device layer. In some embodiments, the interlayer has a U-shaped profile. In some embodiments, a resistance of the interlayer from the substrate to the device layer is greater than about 100 kiloohms. In some embodiments, the doped region has a same doping type as, but a higher doping concentration than, a bulk of the substrate. In some embodiments, a bulk of the device layer is undoped, wherein the photodetector includes: a first contact region in the device layer; and a second contact region in the device layer, wherein the first and second contact regions are respectively on opposite sides of the device layer and have opposite doping types. In some embodiments, the image sensor further includes a cap layer covering and localized to the device layer, wherein the cap layer is a semiconductor material with a larger bandgap than the device layer.

In some embodiments, the present disclosure provides another image sensor including: a substrate; a device layer overlying and recessed into the substrate; a cap layer overlying the device layer; a photodetector in the device layer; and an interlayer cupping an underside of the device layer and separating the device layer from the substrate; wherein the substrate, the cap layer, the interlayer, and the device layer are semiconductors, wherein the interlayer is undoped, and wherein the device layer has a different absorption coefficient than the substrate. In some embodiments, the substrate includes a substrate implant region cupping an underside of the device layer and extending along a top surface of the substrate, wherein the substrate implant region has a different doping concentration than a bulk of the substrate. In some embodiments, the device layer has a higher absorption coefficient than the interlayer and the cap layer. In some embodiments, the device layer has a higher absorption coefficient for wavelengths of about 850-1550 nanometers than the substrate. In some embodiments, the substrate includes an implant isolation region having an opposite doping type as a bulk of the substrate, wherein the implant isolation region extends in a closed path to surround the device layer. In some embodiments, the interlayer has a pair of sidewall segments, wherein the sidewall segments are respectively on opposite sides of the device layer and face away from the device layer, and wherein the cap layer is laterally between and laterally spaced from the sidewall segments.

In some embodiments, the present disclosure provides a method for forming an image sensor including: depositing a hard mask layer covering a substrate; performing a first etch into the hard mask layer and the substrate to form a cavity, wherein the first etch forms a layer of crystalline damage lining the cavity in the substrate; performing a second etch into the substrate to remove the layer of crystalline damage, wherein the second etch laterally recesses a sidewall of the substrate so a portion of the hard mask layer overhangs the cavity; epitaxially growing an interlayer lining the cavity, wherein the interlayer is undoped and has a top surface underlying the portion of the hard mask layer; epitaxially growing a device layer filling the cavity over the interlayer, wherein the device layer is a different semiconductor material than the interlayer; and forming a photodetector in the device layer. In some embodiments, the second etch includes CDE or wet etching. In some embodiments, the first etch etches the substrate and the hard mask layer by ion bombardment, and wherein the second etch etches the substrate without ion bombardment. In some embodiments, the method further includes: depositing a sacrificial dielectric layer lining the cavity; performing a blanket ion implantation into the substrate through the sacrificial dielectric layer to form a substrate implant region lining the cavity; and removing the sacrificial dielectric layer. In some embodiments, the sacrificial dielectric layer is deposited by thermal oxidation of the substrate. In some embodiments, the method further includes epitaxially growing a cap layer covering the device layer, wherein the cap layer has a different absorption coefficient for infrared radiation than the device layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor, comprising:
   a semiconductor substrate;
   a semiconductor device layer overlying the semiconductor substrate and inset into the semiconductor substrate;
   a photodetector in the semiconductor device layer; and
   an undoped semiconductor layer having a different bandgap than the semiconductor device layer and extending along a sidewall of the semiconductor device layer and a bottom surface of the semiconductor device layer.

2. The image sensor according to claim 1, wherein the undoped semiconductor layer has a U-shaped profile.

3. The image sensor according to claim 1, wherein the undoped semiconductor layer has a ring-shaped top geometry that surrounds the semiconductor device layer.

4. The image sensor according to claim 1, wherein the undoped semiconductor layer has a bandgap that is more than a bandgap of the semiconductor device layer.

5. The image sensor according to claim 1, further comprising:
   a semiconductor cap layer covering the semiconductor device layer and having a different bandgap than the semiconductor device layer.

6. The image sensor according to claim 1, wherein the undoped semiconductor layer directly contacts the semiconductor substrate and shares a semiconductor material with the semiconductor substrate.

7. An image sensor, comprising:
   a semiconductor substrate;
   a semiconductor device layer recessed into a top of the semiconductor substrate; and
   a photodetector in the semiconductor device layer;
   wherein the semiconductor substrate comprises a doped region, wherein the doped region extends along a sidewall of the semiconductor device layer and a bottom surface of the semiconductor device layer, and wherein the doped region is spaced from the semiconductor device layer and has a bottommost boundary that is closer to the bottom surface of the semiconductor device layer than to a bottom surface of the semiconductor substrate.

8. The image sensor according to claim 7, further comprising:
a semiconductor interlayer separating the doped region from the semiconductor device layer.

9. The image sensor according to claim 7, wherein the semiconductor substrate is silicon, and wherein the semiconductor device layer comprises germanium.

10. The image sensor according to claim 7, wherein the semiconductor device layer and the semiconductor substrate have different coefficients of thermal expansion.

11. The image sensor according to claim 7, wherein the doped region extends along the sidewall of the semiconductor device layer and the bottom surface of the semiconductor device layer as a layer having a substantially uniform thickness.

12. The image sensor according to claim 7, wherein the semiconductor substrate further comprises an implant isolation region extending in a closed path around the semiconductor device layer, wherein the doped region has a sidewall boundary facing the implant isolation region in a direction away from the semiconductor device layer, and wherein the sidewall boundary is spaced from the implant isolation region.

13. The image sensor according to claim 7, wherein the semiconductor substrate further comprises an implant isolation region extending in a closed path around the semiconductor device layer, and wherein the doped region further extends along a top surface of the semiconductor substrate, away from the semiconductor device layer, to cross the closed path of the implant isolation region.

14. An image sensor, comprising:
a semiconductor substrate;
a semiconductor device layer recessed into a top of the semiconductor substrate;
a semiconductor cap layer overlying the semiconductor device layer; and
a photodetector in the semiconductor device layer;
wherein the semiconductor substrate has a pair of semiconductor sidewalls facing the semiconductor device layer and respectively on opposite sides of the semiconductor device layer, and wherein a separation between the pair of semiconductor sidewalls is greater than a width of the semiconductor device layer.

15. The image sensor according to claim 14, further comprising:
a semiconductor layer separating the semiconductor device layer from the pair of semiconductor sidewalls.

16. The image sensor according to claim 14, wherein the semiconductor device layer has a higher absorption coefficient for infrared radiation than the semiconductor substrate.

17. The image sensor according to claim 14, wherein the separation between the pair of semiconductor sidewalls is greater than a width of the semiconductor cap layer.

18. The image sensor according to claim 17, wherein the semiconductor cap layer has a cap sidewall, which is laterally offset from and laterally between the pair of semiconductor sidewalls.

19. The image sensor according to claim 15, wherein the semiconductor substrate is doped at the pair of semiconductor sidewalls, and wherein the semiconductor layer is undoped.

20. The image sensor according to claim 15, wherein a top surface of the semiconductor layer is elevated relative to a top surface of the semiconductor substrate and is recessed relative to a top surface of the semiconductor cap layer.

* * * * *